(12) United States Patent
Kim

(10) Patent No.: US 8,866,219 B2
(45) Date of Patent: Oct. 21, 2014

(54) SEMICONDUCTOR DEVICE WITH VERTICAL CHANNEL TRANSISTOR AND METHOD OF OPERATING THE SAME

(75) Inventor: Daeik Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 189 days.

(21) Appl. No.: 13/287,304

(22) Filed: Nov. 2, 2011

(65) Prior Publication Data
US 2012/0119289 A1    May 17, 2012

(30) Foreign Application Priority Data

Nov. 12, 2010    (KR) .................. 10-2010-0112837

(51) Int. Cl.
*H01L 29/66* (2006.01)
*H01L 29/78* (2006.01)
*H01L 29/423* (2006.01)
*H01L 27/108* (2006.01)

(52) U.S. Cl.
CPC ...... *H01L 29/7827* (2013.01); *H01L 29/66666* (2013.01); *H01L 29/4236* (2013.01); *H01L 27/10876* (2013.01)
USPC .................. 257/331; 257/330; 257/E29.262

(58) Field of Classification Search
USPC .................. 257/330, 331, E29.262
See application file for complete search history.

(56) References Cited

U.S. PATENT DOCUMENTS 7,387,931 B2    6/2008    Seo et al.
7,564,084 B2    7/2009    Song et al.

FOREIGN PATENT DOCUMENTS

| KR | 10-0673012 | 1/2007 |
| KR | 10-0688576 | 2/2007 |
| KR | 10-2007-0047069 | 5/2007 |

*Primary Examiner* — Amar Movva
(74) *Attorney, Agent, or Firm* — Lee & Morse, P.C.

(57) ABSTRACT

Provided is a semiconductor device including a substrate having active patterns extending between first trenches and between second trenches (the first and second trenches intersecting each other), and gate patterns disposed within the first trenches, wherein each of the active patterns includes lower and upper impurity regions, and a channel region between the lower and upper impurity regions, the lower and upper impurity regions being vertically spaced apart from each other and having a conductivity type different from the substrate, and the channel region having the same conductivity type as the substrate, and a bottom surface of the gate pattern is closer to a bottom surface of the first trench than the lower impurity region.

17 Claims, 28 Drawing Sheets

SEMICONDUCTOR DEVICE WITH VERTICAL CHANNEL TRANSISTOR AND METHOD OF OPERATING THE SAME

CROSS-REFERENCE TO RELATED APPLICATIONS

Korean Patent Application No. 10-2010-0112837, filed on Nov. 12, 2010, in the Korean Intellectual Property Office, and entitled: "Semiconductor Device with Vertical Channel Transistor and Method of Operating the Same," is incorporated by reference herein in its entirety.

BACKGROUND

1. Field

Embodiments relate to a semiconductor device with a vertical channel transistor and a method of operating the same.

2. Description of the Related Art

To increase an integration of semiconductor device, efforts for reducing a line width of pattern of semiconductor device have been performed. However, technologies of forming a fine pattern for a next generation semiconductor device require a new and high cost exposure technology.

As an alternative, methods of reducing an occupation area of unit cell constituting a semiconductor device have been studied. For example, a vertical channel transistor including a source electrode and a drain electrode formed on an upper portion and a lower portion of a channel region, respectively, is actively being studied. In the case of the vertical channel transistor, since separate areas for source and drain electrodes are not needed, an integration of semiconductor device may be greatly increased compared to a conventional planar MOS-FET (metal-oxide semiconductor field-effect transistor) in which source and drain electrodes are disposed on both sides of the channel region. When the vertical channel transistor is manufactured using the next generation fine pattern formation technology, an integration of semiconductor device, including the vertical channel transistor may be increased. However, in the case of the conventional vertical channel transistor, technical difficulties different from a conventional two dimensional transistor exist, which pose challenges to mass-production of the semiconductor device.

SUMMARY

Embodiments provide a semiconductor device including a substrate having active patterns extending between first trenches and between second trenches (the first and second trenches intersecting each other), and gate patterns disposed within the first trenches, wherein each of the active patterns includes a lower impurity region, an upper impurity region, and a channel region between the lower and upper impurity regions, the lower and upper impurity regions being vertically spaced apart from each other and having a conductivity type different from the substrate, and the channel region having the same conductivity type as the substrate, and a bottom surface of the gate pattern is closer to a bottom surface of the first trench than the lower impurity region.

The semiconductor device may further include lower interconnections in the second trenches, the lower interconnections electrically connecting the lower impurity regions and connecting the gate patterns, wherein, the lower interconnections are disposed between a top surface of the gate pattern and a bottom surface of the gate pattern.

Each of the gate patterns may include vertical electrode portions, the vertical electrode portions being perpendicular to a top surface of the substrate, wherein the plurality of gate patterns are horizontally aligned and spaced from one another, and each gate pattern is disposed in a different one of the first trenches.

The gate patterns may be positioned adjacent to sidewalls of every other active pattern starting with a first active pattern in every other first trench, starting with an outermost first trench, and are disposed adjacent to sidewalls of every other active pattern starting with a second active pattern in every other first trench, starting with a first trench adjacent to the outermost first trench. One gate pattern may be disposed around one of the active patterns.

Each of the gate patterns may include vertical electrode portions that extend perpendicular to a top surface of the substrate, and a horizontal connection portion connecting lower regions of the vertical electrode portions, the horizontal connection portion intersecting the second trenches. The vertical electrode portions may include short vertical electrode portions and long vertical electrode portions alternately arranged in the first trenches, wherein top surfaces of the short and long vertical electrode portions may be higher than the lower impurity region.

The semiconductor device may further include upper interconnections over the gate patterns, the upper interconnections crossing over the second trenches, wherein, the long vertical electrode portions in one of the gate patterns may be directly connected to the upper interconnection and top surfaces of the short vertical electrode portions in another one of the gate patterns may be spaced apart from the upper interconnection.

A top surface of the horizontal connection portion may be closer to a bottom surface of the first trench than the lower impurity region. Two gate patterns may be disposed around one of the active patterns. Top surfaces of the gate patterns may be under a bottom surface of the upper impurity region.

The gate pattern may include a lower gate pattern and an upper gate pattern that are sequentially stacked, wherein the lower gate pattern is formed of material having a lower resistivity than the upper gate pattern.

A method of operating the semiconductor device may include a cell selection step for inverting the channel region of a selected active pattern of the active patterns, including applying a select voltage for inverting the channel region to one of the gate patterns adjacent to the selected active pattern and applying an unselect voltage capable for inverting the lower impurity region to the other ones of the gate patterns. The product of the select voltage and the unselect voltage may be a negative number. An absolute value of the unselect voltage may be greater than an absolute value of the select voltage.

Embodiments also provide a semiconductor device including a substrate having first trenches and second trenches, the first and second trenches intersecting each other, gate patterns disposed within the first trenches, and active patterns vertically extending between the first trenches and between the second trenches, each of the active patterns including a vertical stack of a lower impurity region, a channel region, and an upper impurity region, in that order, wherein the lower impurity region and the upper impurity region have a conductivity type different from the substrate, the channel region has the same conductivity type as the substrate, the gate patterns overlap and extend lower than the lower impurity region. The gate patterns may include horizontal portions extending from a bottom surface of the gate patterns, the horizontal portions intersecting the second trenches.

A top surface of the gate patterns may be lower than the upper impurity region. The gate patterns may include horizontal portions extending from a bottom surface of the gate patterns, the horizontal portions intersecting the second trenches. A lower portion of the horizontal portion may include a material of a lower resistivity than a remainder of the gate pattern.

BRIEF DESCRIPTION OF THE FIGURES

The above and other features and advantages will become more apparent to those of ordinary skill in the art by describing in detail exemplary embodiments with reference to the attached drawings, in which.

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION

Figure 1A:
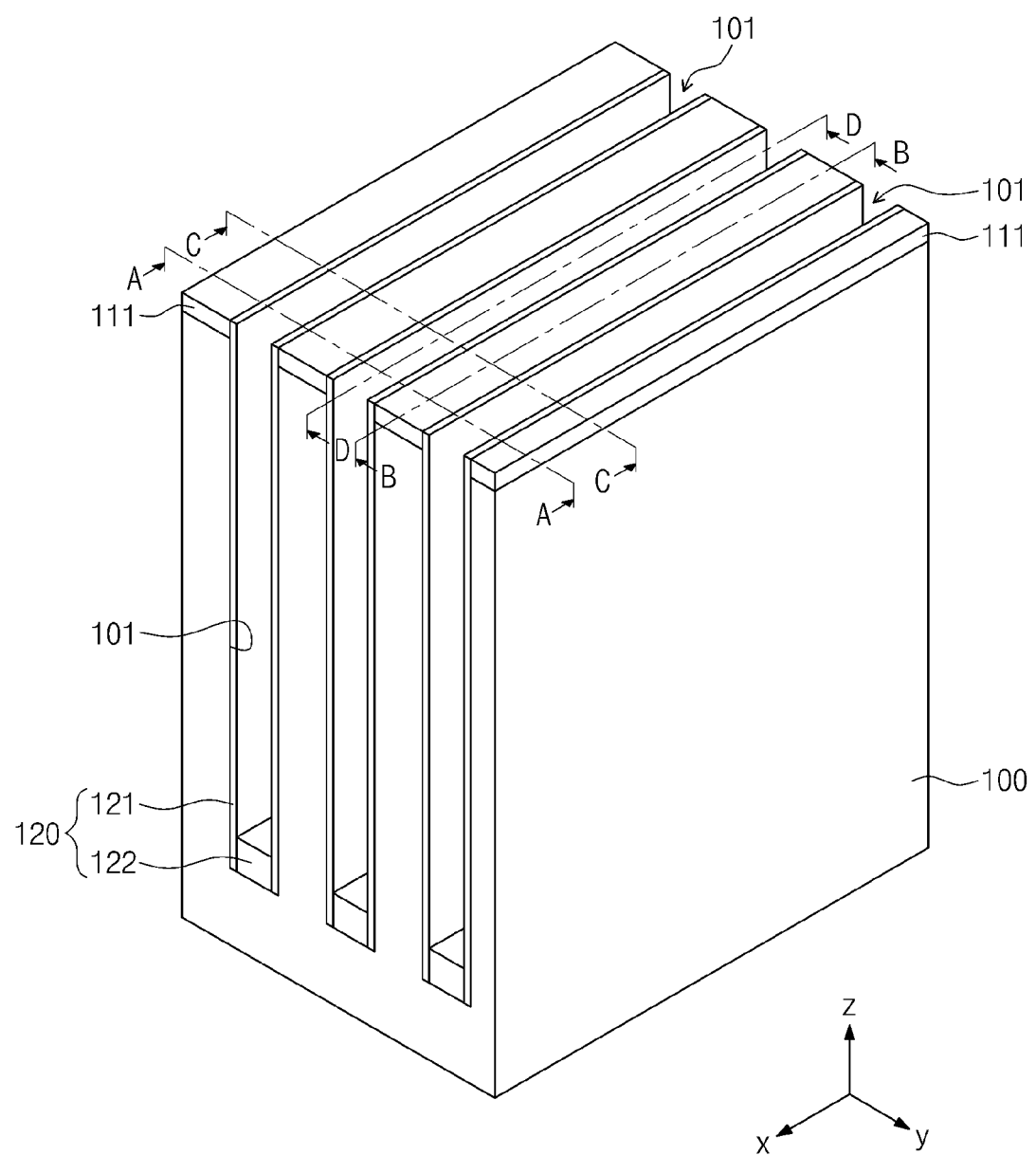
FIGS. 1A, 2A, 3A, 4A, 5A, 6A, and 7A illustrate perspective views of stages in a method of manufacturing the semiconductor device in accordance with some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

Figure 8A:
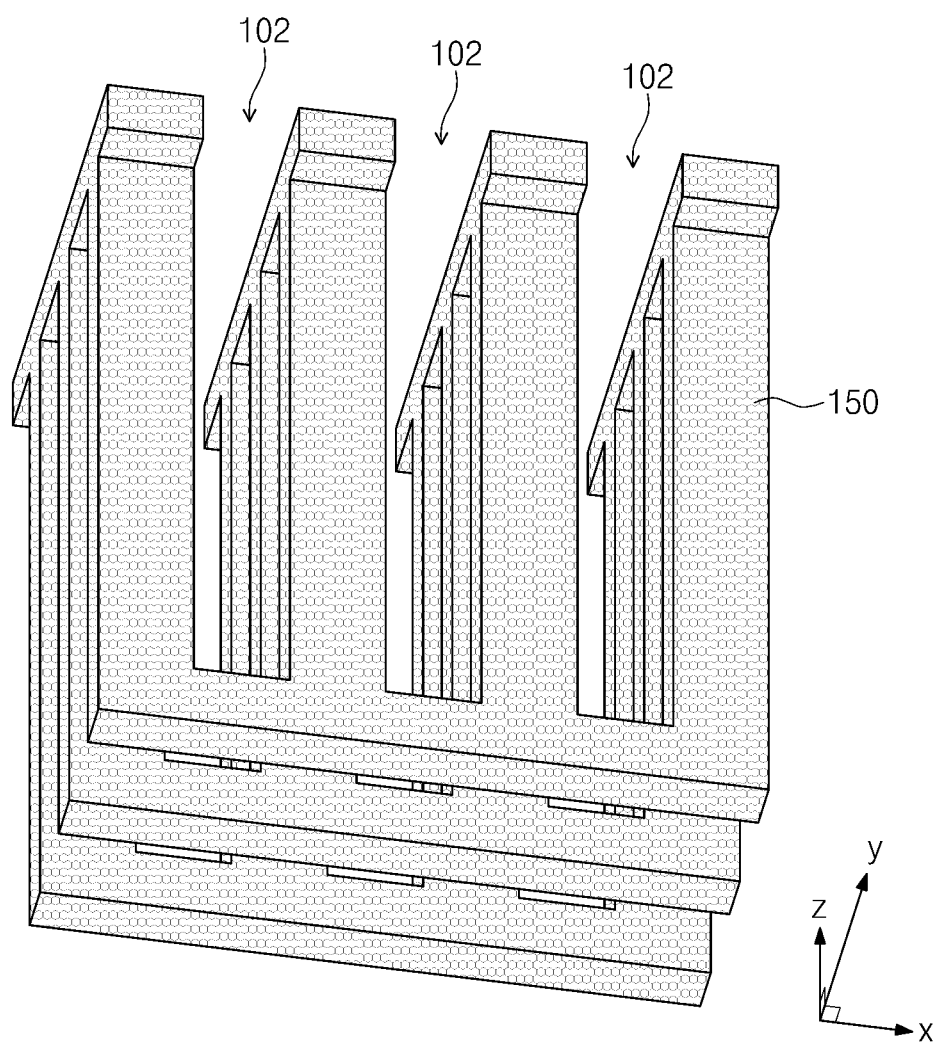
FIGS. 8A and 8B illustrate perspective views of a gate conductive film and gate electrodes formed as a result of manufacturing steps explained with reference to FIGS. 3A and 5A respectively.
Figure 8B:
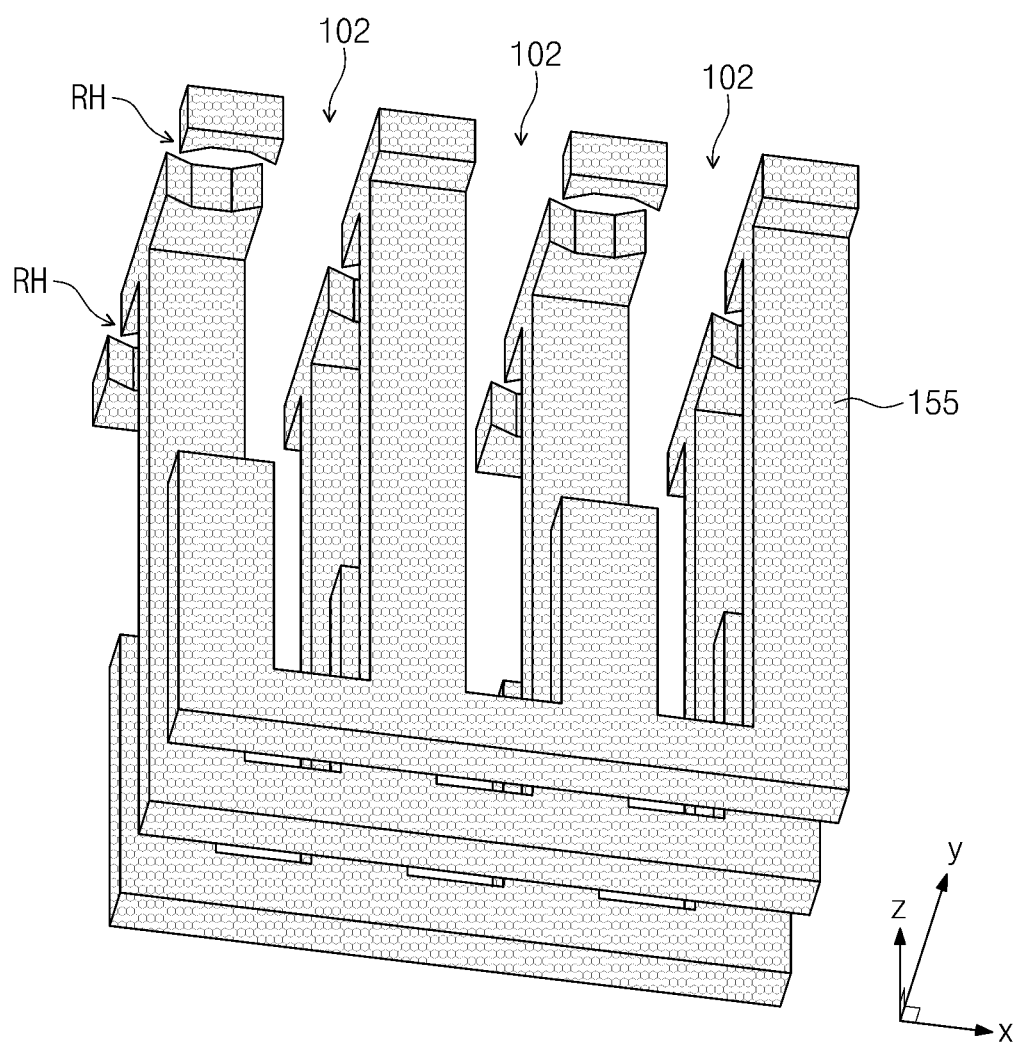
Figure 9:
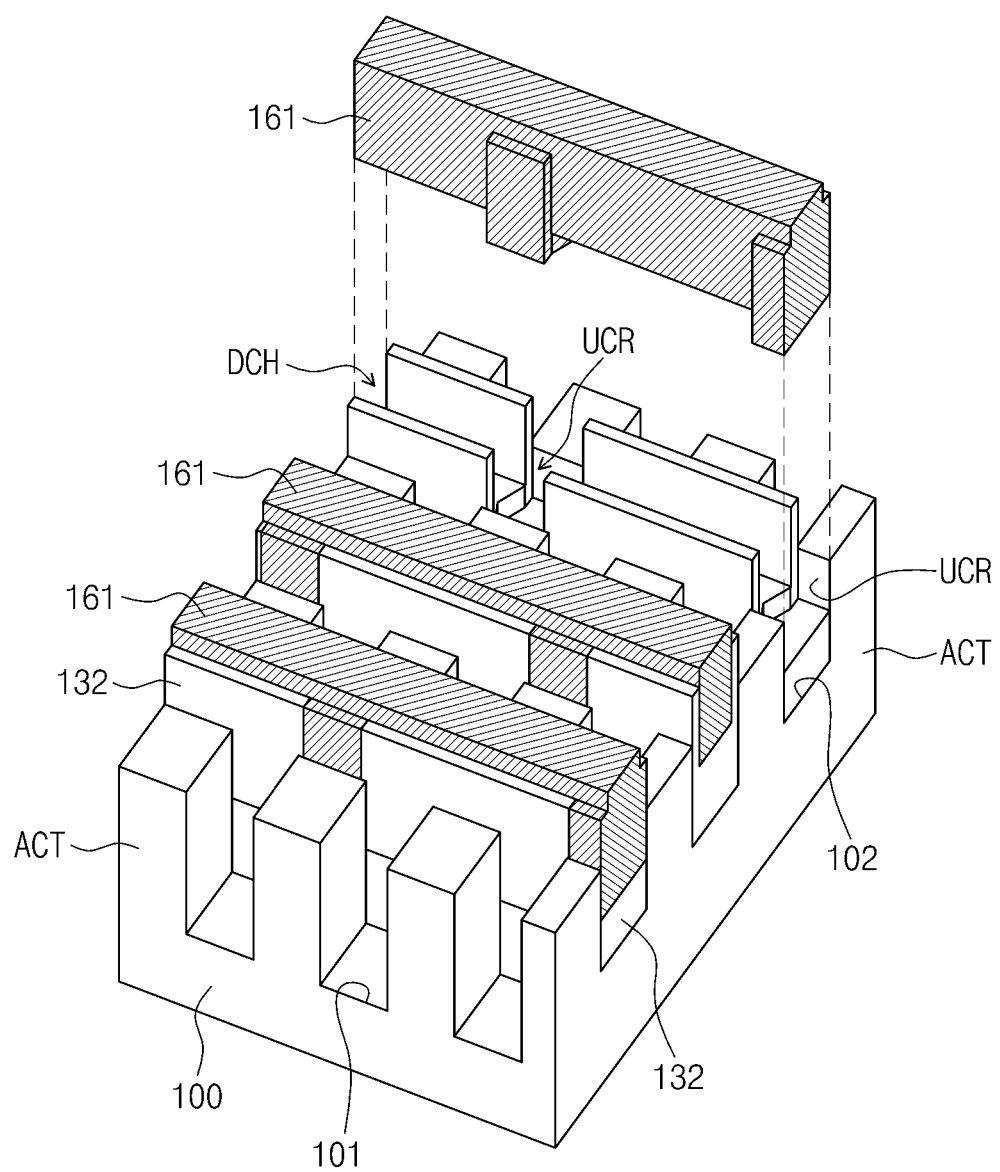
FIGS. 9 and 10 illustrate perspective views of a relative disposition between lower interconnections and active patterns formed as a result of the step explained with reference to FIG. 4A.
Figure 10:
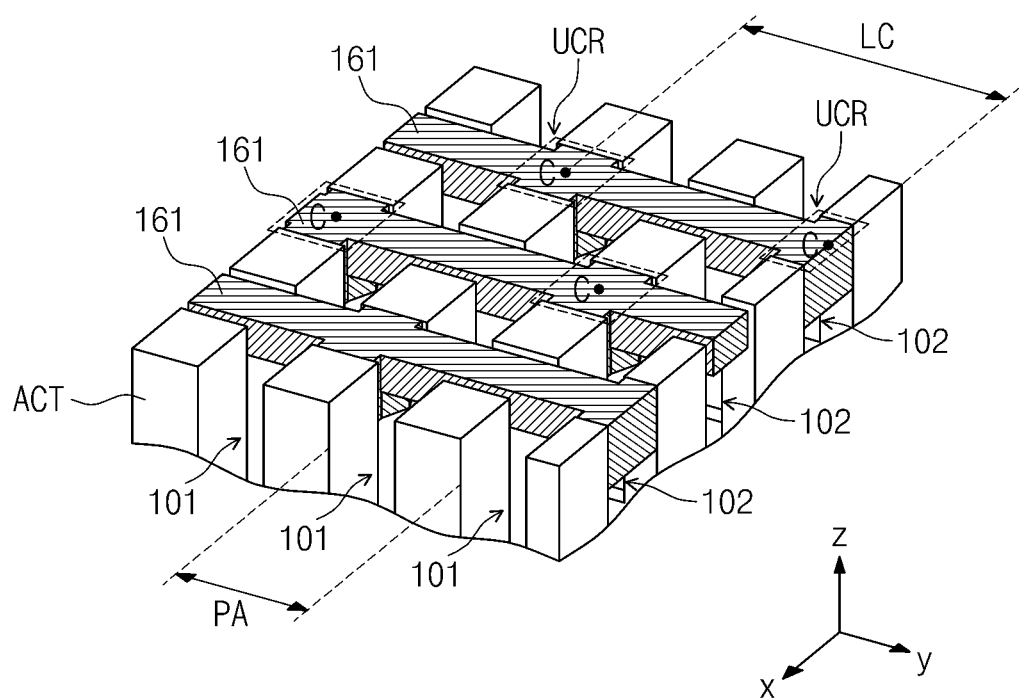

FIGS. 1A, 2A, 3A, 4A, 5A, 6A, and 7A illustrate perspective views of stages in a method of manufacturing the semiconductor device, in accordance with some embodiments. FIGS. 1B, 2B, 3B, 4B, 5B, 6B, and 7B illustrate cross sectional views of stages in a method of manufacturing the semiconductor device in accordance with some embodiments. FIGS. 8A, 8B, 9, and 10 illustrate perspective views of some technical features in accordance with some embodiments. More specifically, FIGS. 8A and 8B illustrate perspective views of a gate conductive film and gate electrodes formed as a result of manufacturing steps explained with reference to FIGS. 3A and 5A, respectively. FIGS. 9 and 10 illustrate perspective views of a relative disposition between lower interconnections and active patterns formed as a result of the step explained with reference to FIG. 4A.

Figure 1B:
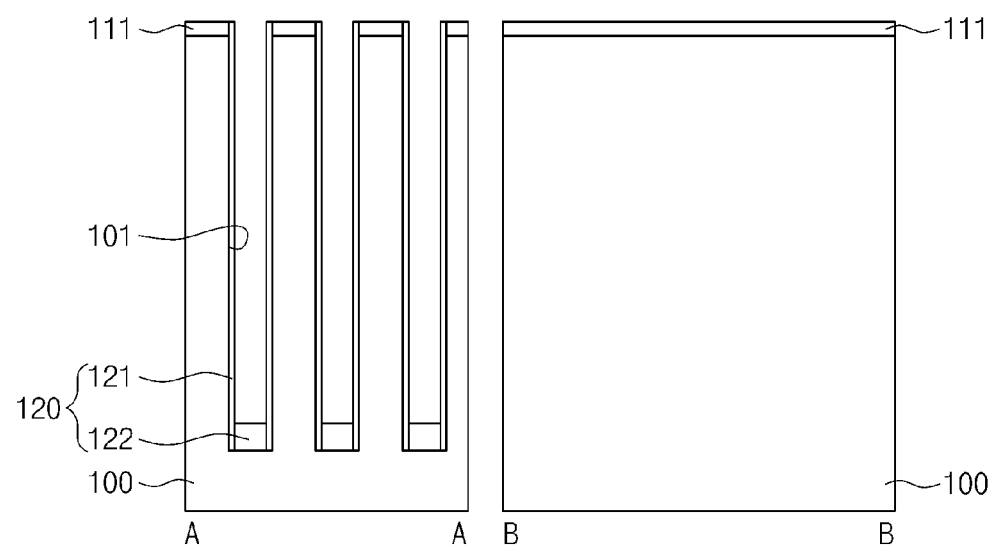
FIGS. 1B, 2B, 3B, 4B, 5B, 6B, and 7B illustrate cross sectional views for explaining a method of manufacturing the semiconductor device in accordance with some embodiments.
Figure 1B:
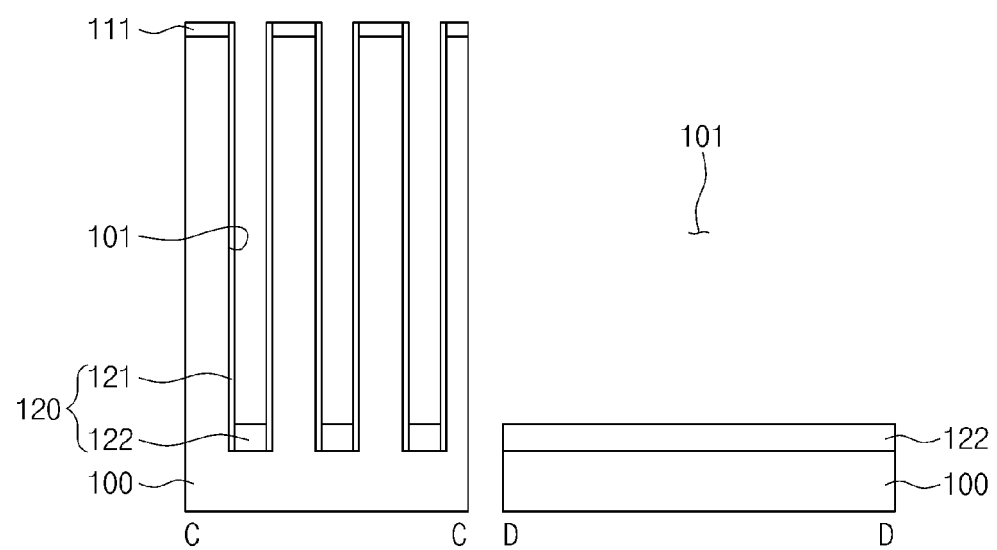

Referring to FIGS. 1A and 1B, after forming first trenches 101 by patterning a substrate 100, first insulating patterns 120 covering inner walls of the first trenches 101 may be formed.

The substrate 100 may have a top surface parallel to an xy-plane and the first trenches 101 may be formed parallel to an x axis direction. In an implementation, the substrate may have opposing top and bottom surfaces, and opposing side surfaces. The side surfaces may extend between and connect the top and bottom surfaces. Each of the first trenches 101 may extend between and connect the top and bottom surfaces. More specifically, forming the first trenches 101 may include forming first mask patterns 111 having a major axis parallel to the x axis direction as illustrated in FIGS. 1A and 1B, and then anisotropically etching the substrate 100 using the first mask patterns 111 as an etching mask.

Each of the first insulating patterns 120 may include a first sidewall pattern 121 covering a sidewall of the first trench 101 and a first bottom pattern 122 covering a bottom surface of the first trench 101. According to some embodiments, the first bottom pattern 122 may be formed before the first sidewall pattern 121 is formed. In this case, the first sidewall pattern 121 may be formed to cover the sidewall of the first trench 101 exposed by the first bottom pattern 122 using one of a thermal oxidation process, a chemical vapor deposition process, and an atomic layer deposition process. According to some other embodiments, the first sidewall pattern 121 may be formed before the first bottom pattern 122 is formed. For example, the first sidewall pattern 121 may be formed to cover an inner wall or an inner sidewall of the first trench 101 and the first bottom pattern 122 may be formed to locally fill a lower region of the first trench 101 where the first sidewall pattern 121 is formed.

Figure 2A:
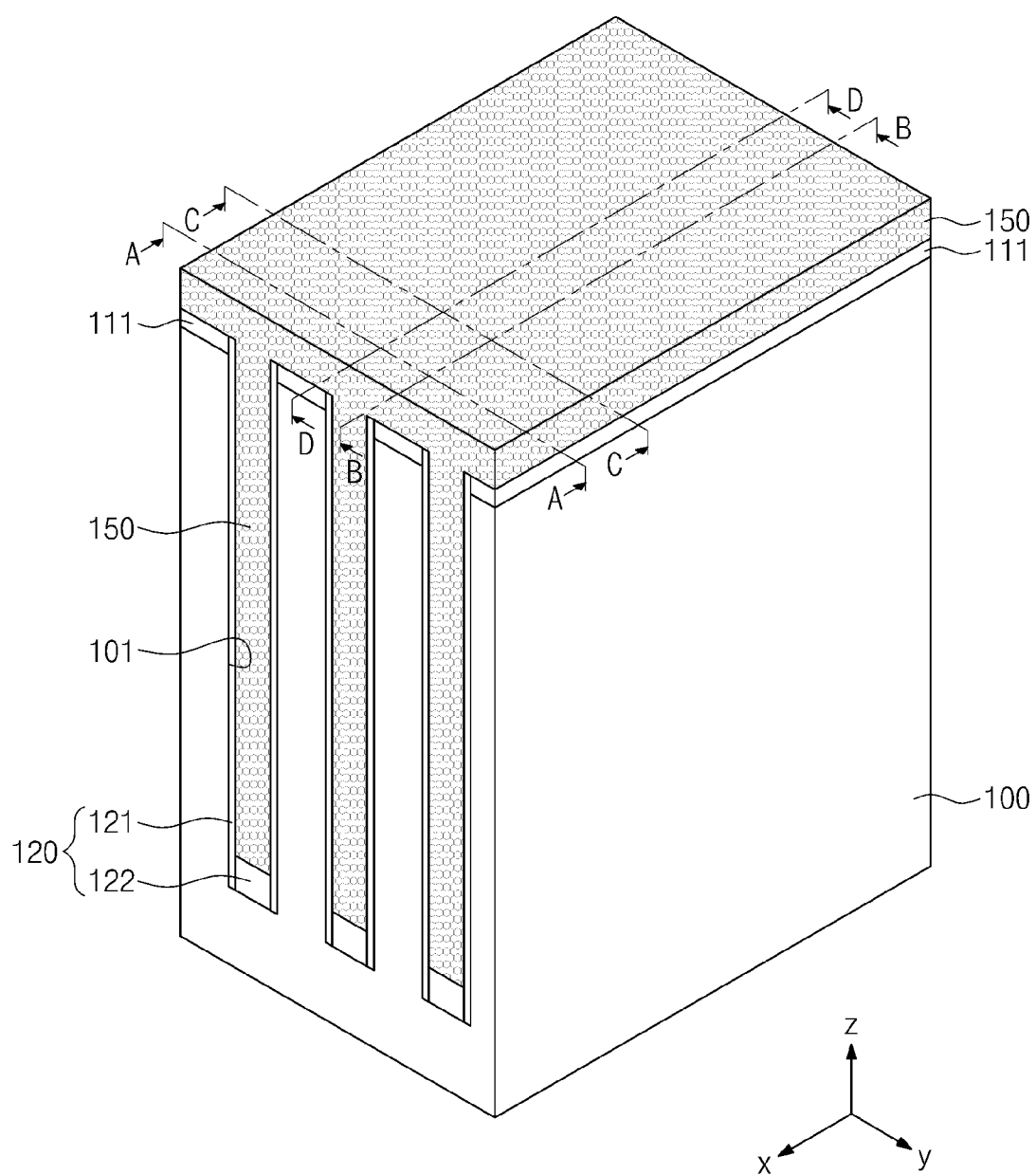
Figure 2B:
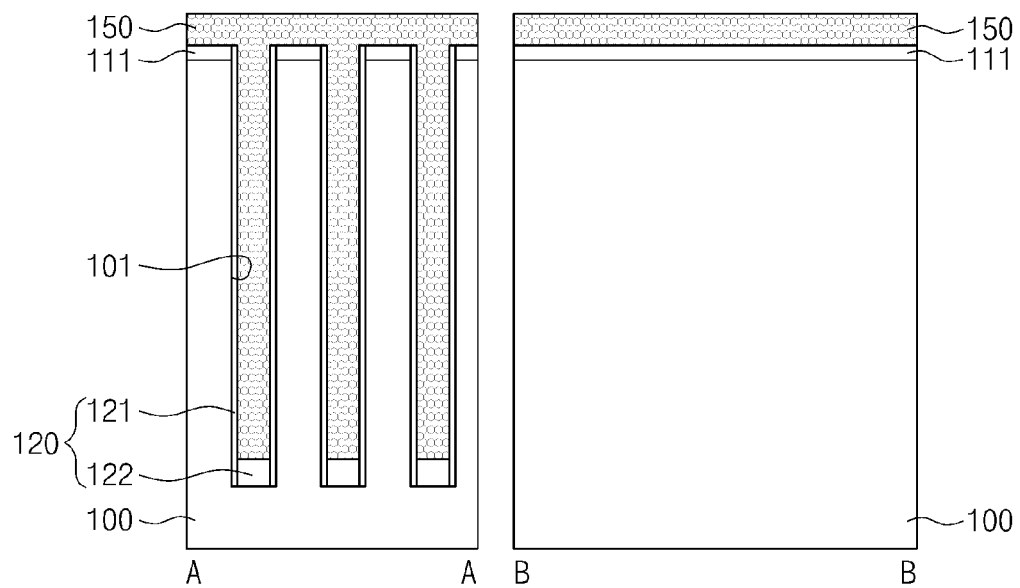
Figure 2B:
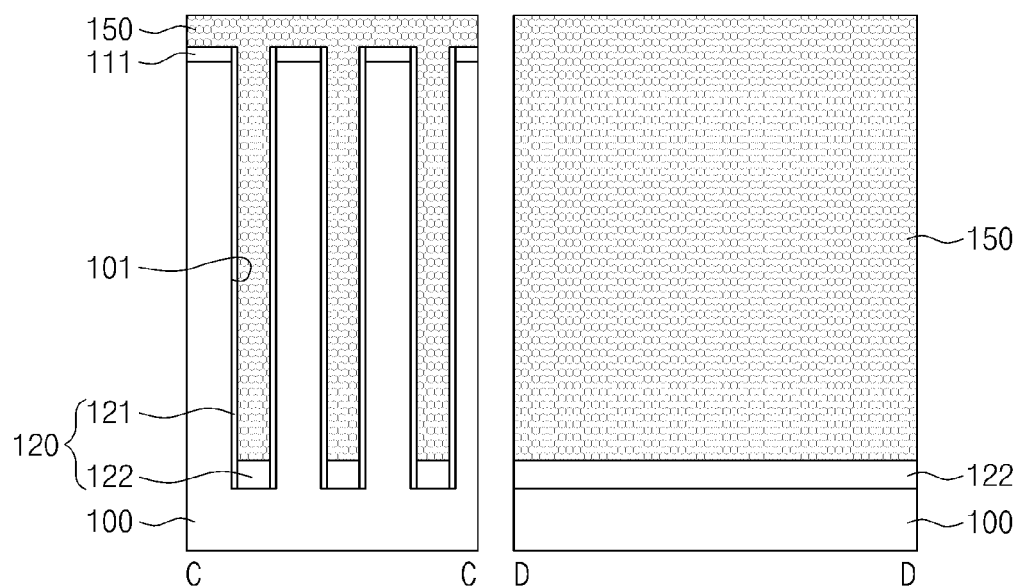

Referring to FIGS. 2A and 2B, a gate conductive film 150 may be formed to fill the first trenches 101 where the first insulating patterns 120 are formed. As illustrated in the drawings, the gate conductive film 150 may be formed to cover a top surface of the first mask pattern 111. However, according to some modified embodiments, etching of a top surface of the gate conductive film 150 may be further conducted until the top surface of the gate conductive film 150 is lower than the top surface of the first mask pattern 111.

The gate conductive film 150 may include at least one conductive material formed using at least one of a chemical vapor deposition process, a physical vapor deposition process, and an electroplating process. For example, the gate conductive film 150 may include at least one of doped polysilicon, metal materials, metal nitrides and metal silicides.

According to some embodiments, the gate conductive film 150 and the first sidewall pattern 121 may be used as a gate electrode and a gate insulating structure, respectively, of a MOSFET, while a sidewall of the substrate 100 may be used as a channel region.

Figure 3A:
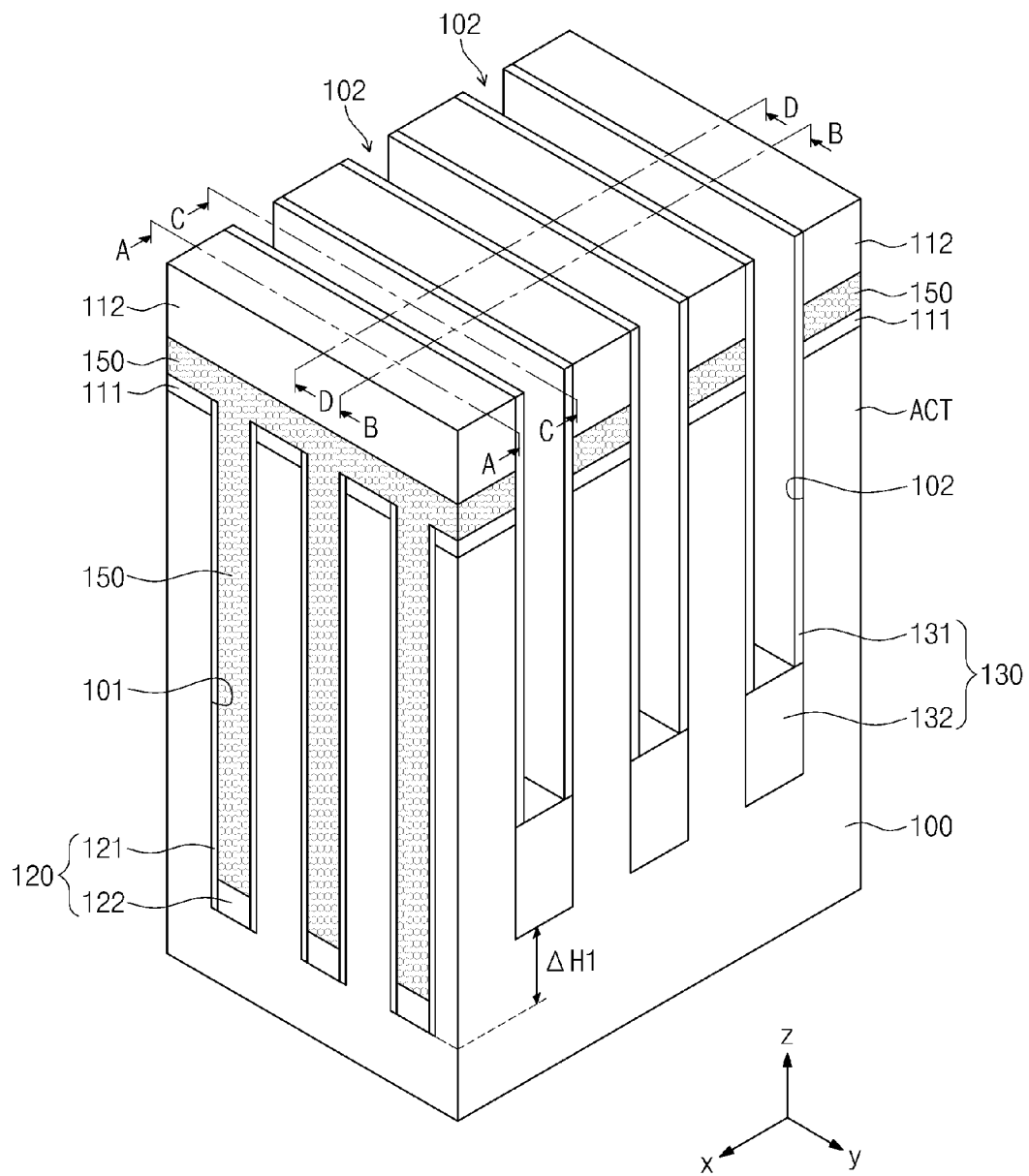
Figure 3B:
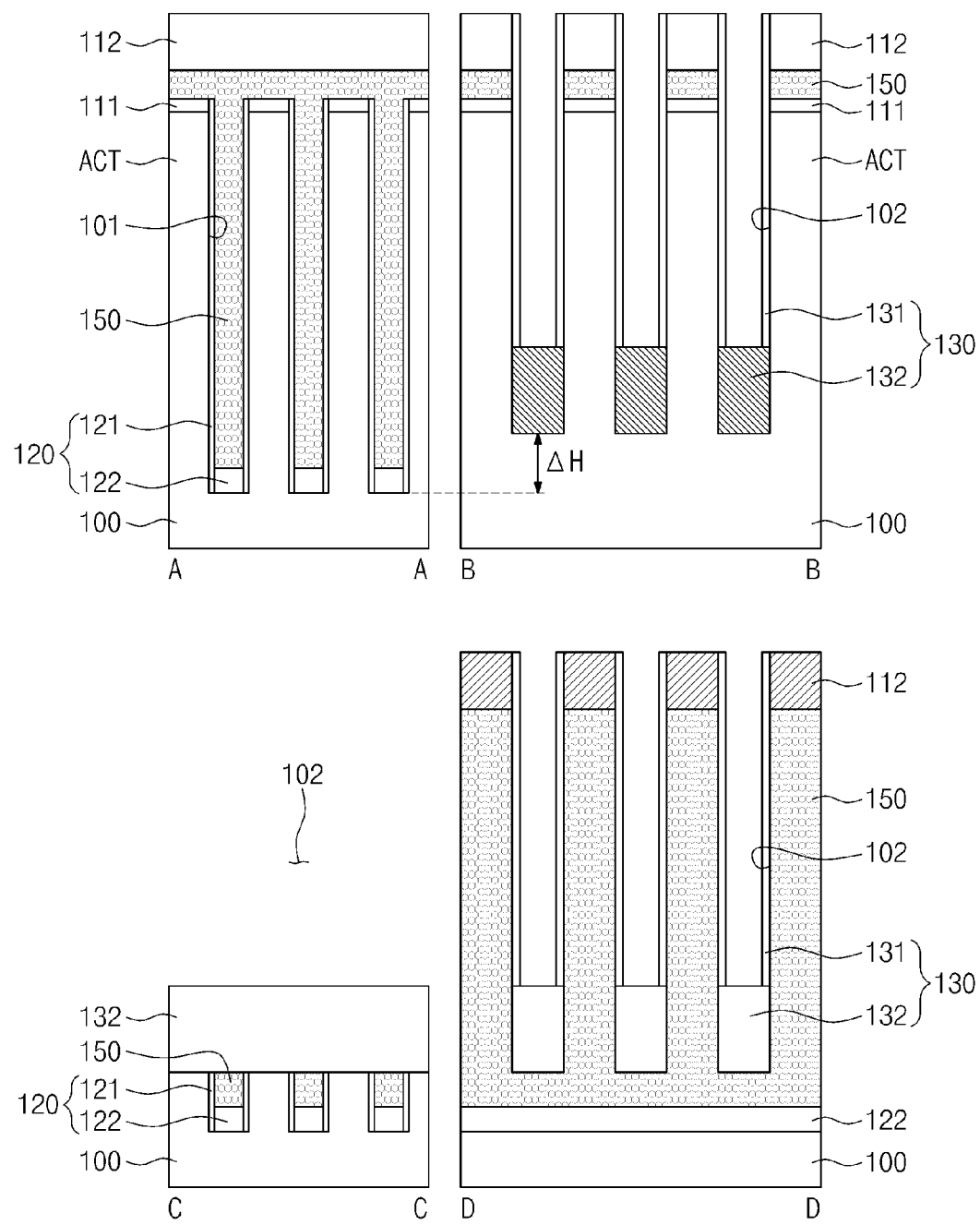

Referring to FIGS. 3A and 3B, after forming second trenches 102 crossing the first trenches 101, second insulating patterns 130 may be formed in the second trenches 102.

Forming the second trenches 102 may include forming the second mask patterns 112 crossing the first trenches 101, and then patterning the substrate 100 and the gate conductive film 150 using the second mask patterns 112 as an etching mask. At this time, the first mask pattern 111 and the first sidewall pattern 121 may be also patterned.

According to some embodiments, as appears by ΔH1 illustrated in FIGS. 3A and 3B, a bottom surface of the second trench 102 may be higher than the bottom surface of the first trench 101. For example, the bottom surface of the second trench 102 may be higher than a bottom surface of the gate conductive film 150 and a top surface of the first bottom pattern 122. Thus, as illustrated in FIG. 8A, at least a portion of the gate conductive film 150 may not be horizontally separated by the second trench 102.

As described above, the second trenches 102 may cross or intersect with the first trenches 101. As such, the substrate 100 may have active patterns ACT that are two dimensionally arranged on an xy plane. In an implementation, the active patterns ACT may be pillars extending from the substrate 100. The active patterns ACT may be formed between two of the first trenches 101. The active patterns ACT may be formed between two of the second trenches 102. Sidewalls of the active patterns ACT defined by the first and second trenches 101 and 102. For example, at least one sidewall of each active pattern ACT may be with a first trench 101 or a second trench 102. The active patterns ACT may be formed through two patterning processes (for the first and second trenches 101 and 102), a cross section of the active pattern ACT projected onto the xy plane may be a square.

Each of the second insulating patterns 130 may include a second sidewall pattern 131 covering an upper sidewall of the second trench 102 and a second bottom pattern 132 covering the bottom surface of the second trench 102. According to some embodiments, the second sidewall pattern 131 may include at least one of a silicon oxide film, a silicon nitride film and a silicon oxynitride film. The second bottom pattern 132 may include a silicon oxide film formed by a thermal oxidation process or a deposition process.

According to some embodiments, the second sidewall pattern 131 may be formed before the second bottom pattern 132 is formed. For example, forming the second trenches 102 and the second insulating patterns 130 may include following four steps of a) forming a preliminary trench having a depth smaller than the intended depth of the second trench 102, b) forming the second sidewall pattern 130 on a sidewall of the preliminary trench, c) extending a bottom surface of the preliminary trench downwardly and d) forming the second bottom pattern 132 filling the extended space. Forming the preliminary trench may include anisotropically etching the substrate 100 and the gate conductive film 150 using the second mask pattern 112 as an etching mask. Extending the bottom surface of the preliminary trench downwardly may include additionally etching the substrate 100 and the gate conductive film 150 that are exposed by the second sidewall patterns 131.

According to some other embodiments, the second bottom pattern 132 may be formed before the second sidewall pattern 131 is formed. For example, forming the second trenches 102 and the second insulating patterns 130 may include following three steps of a) forming the second trenches 102, b) forming the second bottom pattern 132 filling a lower region of the second trench 102, c) forming the second sidewall pattern 131 covering a sidewall of the second trench 102 not covered by the second bottom pattern 132.

Figure 4A:
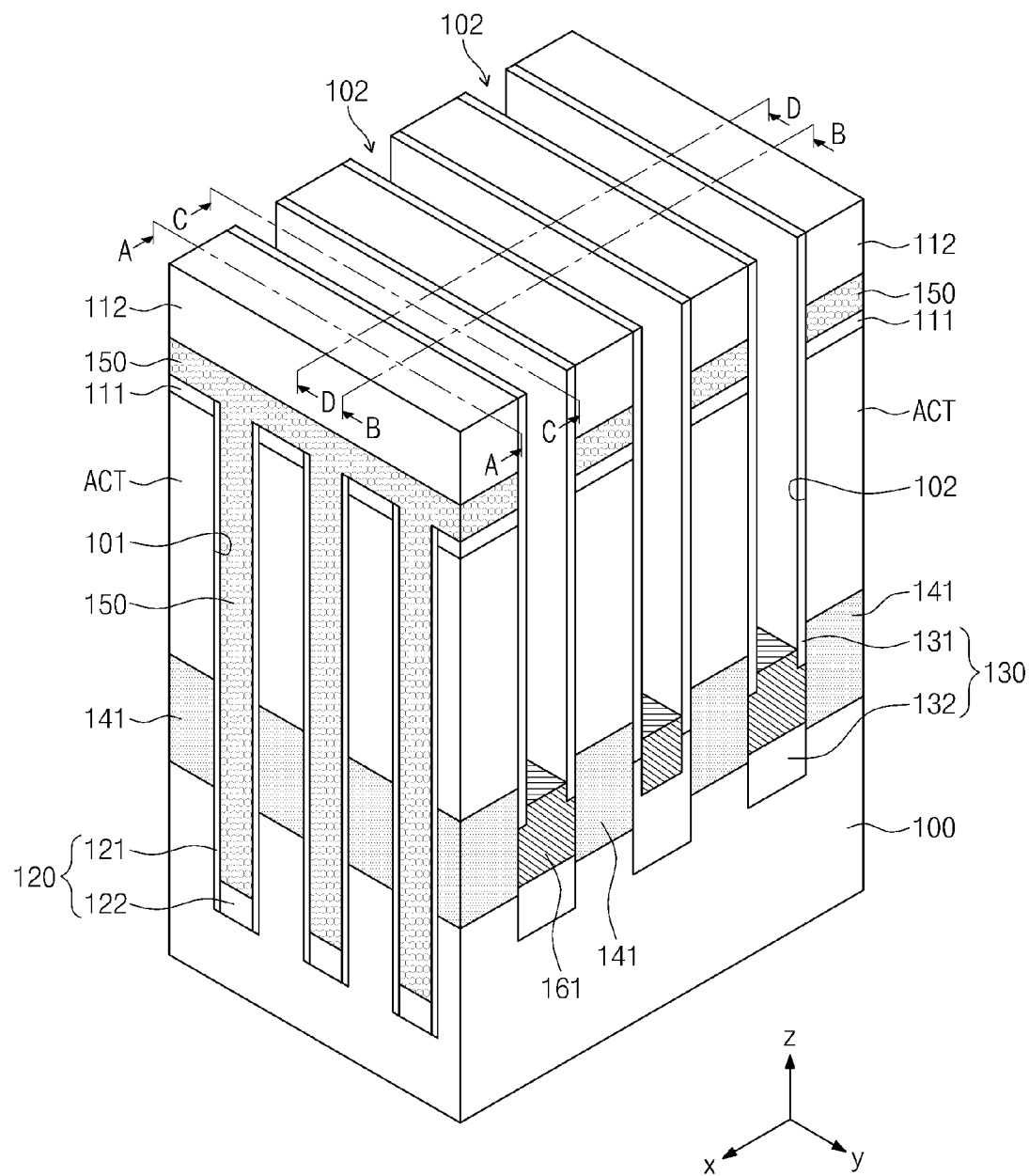
Figure 4B:
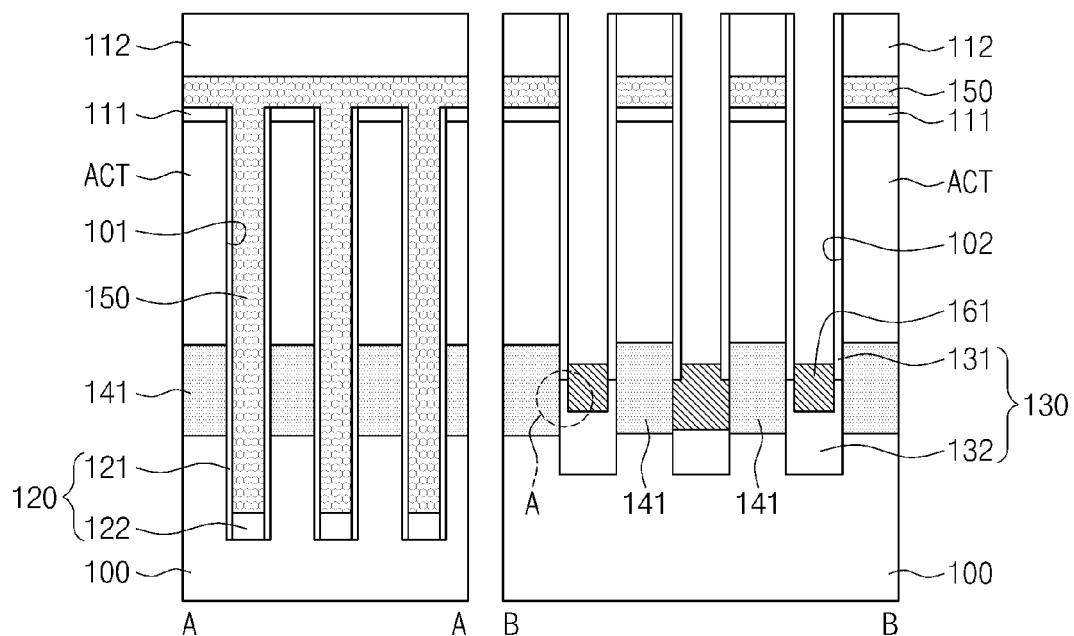
Figure 4B:
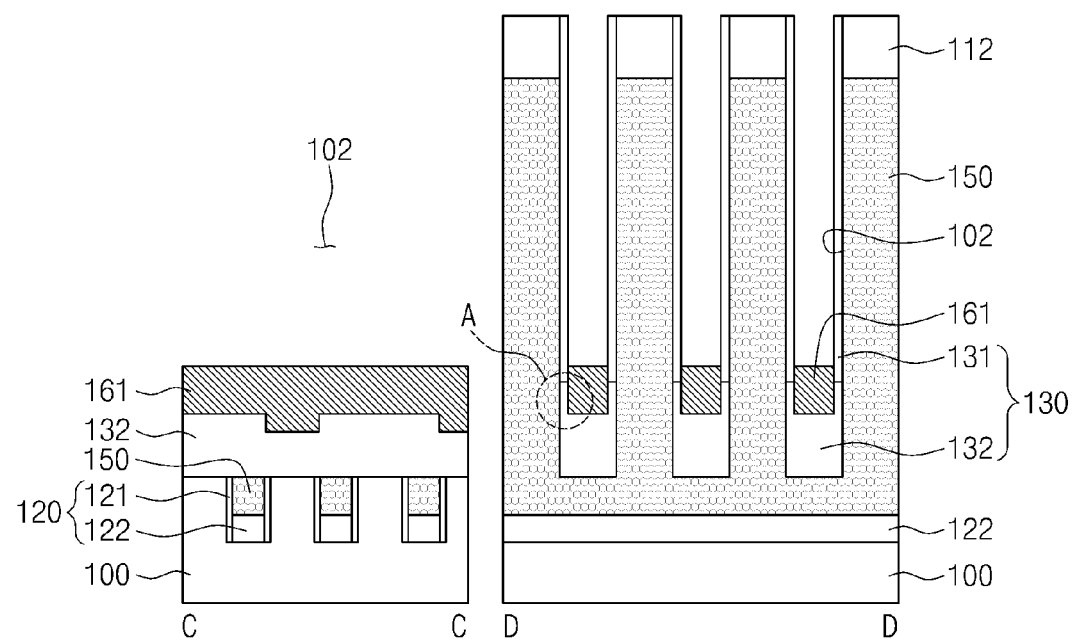

Referring to FIGS. 4A and 4B, a lower impurity region 141 may be formed in a lower region of each of the active patterns ACT and lower interconnections 161 connecting the lower impurity regions 141. This process, as illustrated in FIG. 9, may include patterning the second bottom pattern 132 to form ditches DCH crossing the first trenches 101, and undercut regions UCR exposing sidewalls of the active patterns ACT, injecting impurities into the sidewalls of the active patterns ACT exposed by the undercut region UCR to form the lower impurity regions 141 and then forming the lower interconnections 161 filling the ditches DCH and the undercut regions UCR. Accordingly, the lower interconnections 161 may be connected to the lower impurity regions 141 through the undercut regions UCR.

According to some embodiments, the ditches DCH may be formed by anisotropically etching the second bottom pattern 132 using the second sidewall patterns 131 as an etching mask. Thus, as illustrated in FIG. 9, the ditch DCH may be formed to be spaced apart from the sidewalls of the active patterns ACT in the second trench 102. That is, as illustrated in cross sections of B-B and D-D of FIG. 4B, an upper edge portion A of the second bottom pattern 132 that is not etched during the anisotropic etching may remain under the second sidewall pattern 131. Thus, the ditch DCH and the active patterns ACT adjacent to the ditch DCH may be separated from each other by the upper edge portion A.

The undercut regions UCR may be formed by an additional patterning process. In a two-dimensional arrangement, as illustrated in FIG. 10, centers of the undercut regions UCR may be located in regions that are included in the second trenches 102 but not included in the first trenches 101. In addition, a distance LC between the undercut regions UCR, which is measured along a y axis in one of the second trenches 102, may be greater than a pitch PA (i.e., sum of a width of one of the active patterns and a width of an open space between two adjacent active patterns ACT) of the active pattern ACT. According to an embodiment, in one of the second trenches 102, the distance LC between centers of the undercut regions UCR may be two times the pitch PA of the active pattern ACT. Accordingly, in one of the second trenches 102, the undercut regions UCR may be locally formed between even-numbered ones of active patterns ACT and may not be formed between odd-numbered ones of active patterns ACT, while in another adjacent second trench 102, the undercut regions UCR may be locally formed between odd-numbered ones of active patterns ACT and may not be formed between even-numbered ones of active patterns ACT. For example, as shown in FIG. 10, the undercut regions UCR in a first one or outer most one of the second trenches 102 may be formed between a first pair, a third pair, a fifth pair, etc., of active patterns ACT that extend along either side of the first one of the second trenches 102. The undercut regions UCR in a second one of the second trenches 102 (adjacent to the first or outer most one of the second trenches 102) may be formed between a second pair, a fourth pair, a sixth pair, etc., of active patterns ACT that extend along either side of the second one of the second trenches 102.

Referring to FIG. 11, the lower impurity regions 141 may include a low concentration region and a high concentration region. The low concentration region and/or the high concentration region may be formed to have a different conductivity from the substrate 100. Therefore, the lower impurity region 141 and upper and lower regions of the active pattern ACT disposed under and on the lower impurity region 141 respectively may form a PNP structure or an NPN structure. The upper region of the active pattern ACT may be electrically separated from the substrate 100 or the lower region of the active pattern ACT by the lower impurity region 141. Each of the lower impurity regions 141 may function as a source electrode or a drain electrode in the vertical channel transistor in accordance with an embodiment.

The high concentration region may be formed by injecting impurities into a sidewall of the active pattern ACT exposed through the undercut region UCR and may be directly connected to the lower interconnection 161 through the undercut region UCR. The low concentration region may be formed on the high concentration region and in this case, the low concentration region may provide an advantage of suppressing a short channel effect of the vertical channel transistor. According to some embodiments, the low concentration region may be formed before the high concentration region or the ditches DCH are formed. According to some embodiments, the lower impurity regions 141 may include the high concentration region, and may not include the low concentration region. In other words, the low concentration region may not be formed. According to embodiments in which a low concentration region is not formed, a vertical length of the active pattern ACT or depths of the first and second trenches 101 and 102 that may cause a technical difficulty of a manufacturing process or a difficulty of increasing integration, may be reduced.

The lower interconnections 161 may be formed to fill the ditches DCH and the undercut regions UCR as described above. As a result, the lower interconnections 161 may be connected to the lower impurity regions 141 through the undercut regions UCR. The lower interconnections 161 may be formed to include conductive material such as a metal film. For example, the lower interconnections 161 may include at least one of a barrier metal film and a metal film for an ohmic contact with the lower impurity region 141.

Figure 5A:
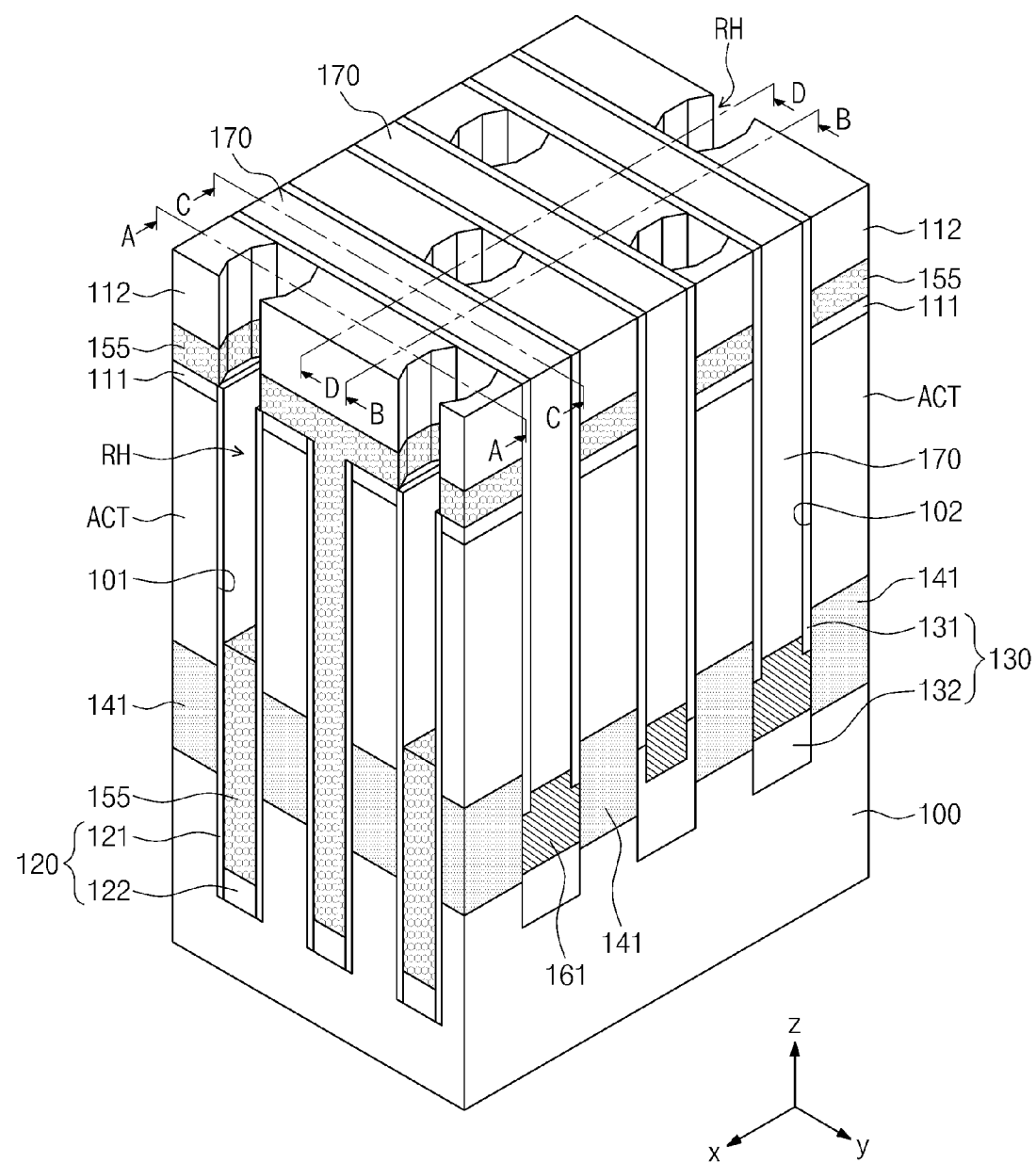
Figure 5B:
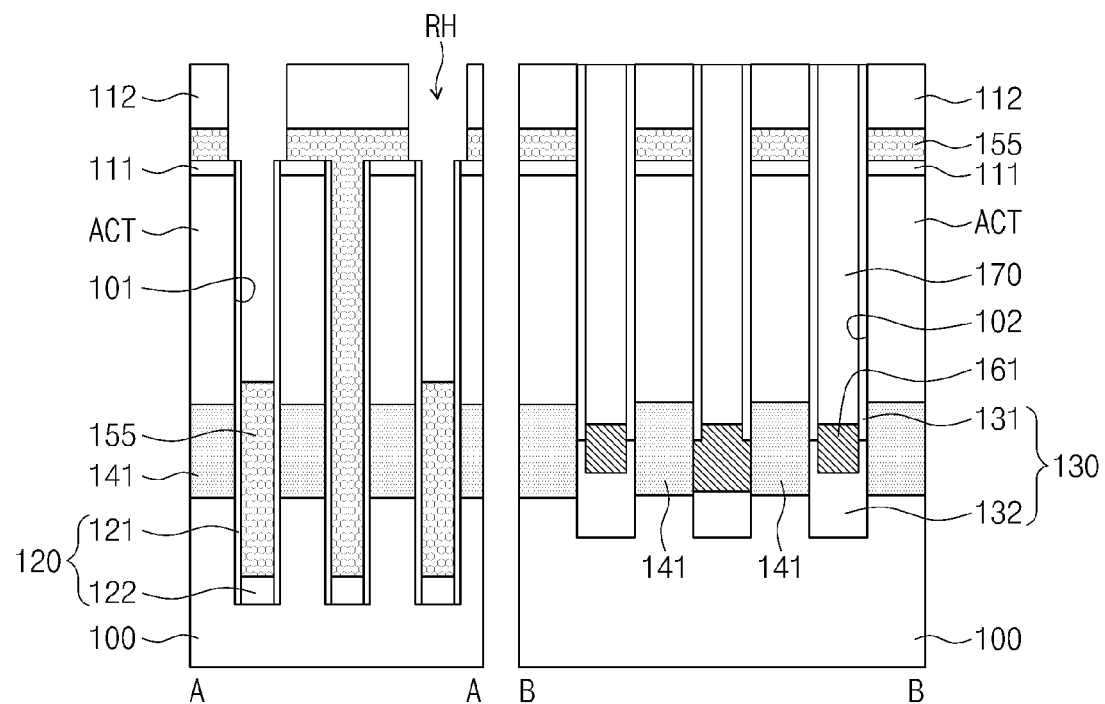
Figure 5B:
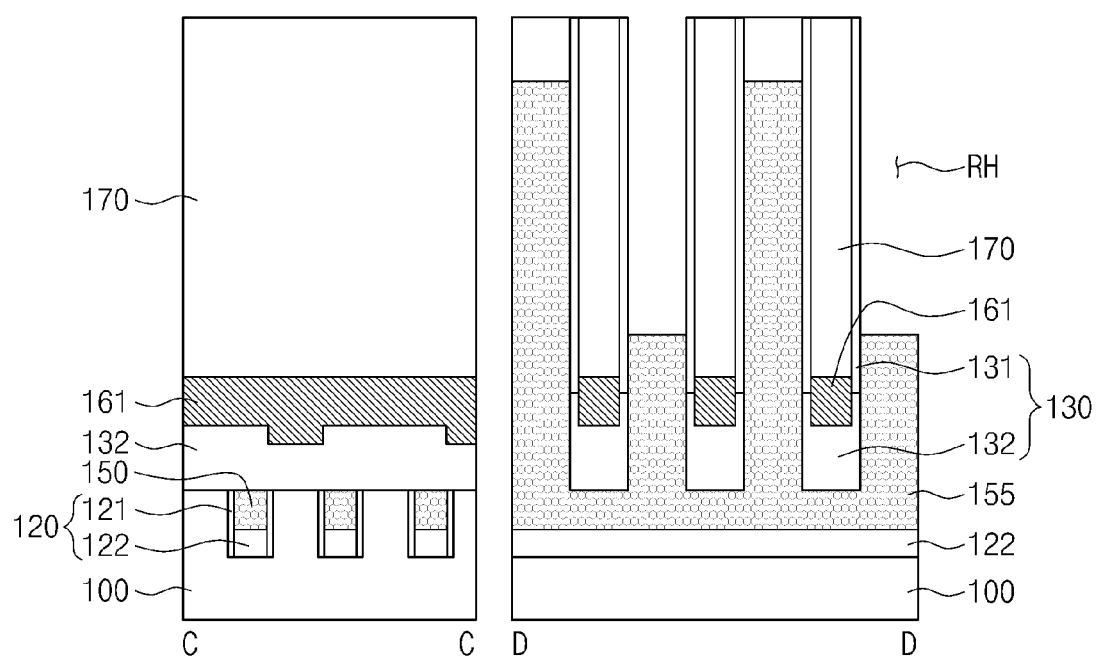

Referring to FIGS. 5A and 5B, the gate conductive film 150 may be patterned to form gate patterns 155. More specifically, this step may include patterning the gate conductive film 150 to form recess holes RH in the first trenches 101.

As illustrated in FIG. 8B, the gate patterns 155 disposed in different first trenches 101 may be separated from one another by the recess holes RH. The recess holes RH may be formed at positions defined by a translational movement of the undercut regions UCR. Thus, the recess holes RH may have the same plane arrangement as the undercut regions UCR but locations of centers of the recess holes RH may be different from those of the undercut regions UCR. The centers of the recess holes RH may be located in regions of the first trenches 101 but not included in regions of the second trenches 102.

Before forming the recess holes RH, first buried patterns 170 may be formed. The first buried patterns 170 may be formed to fill the second trench 102 in which the lower interconnection 161 is formed and may be formed of one of insulating materials. Forming the recess holes RH may be performed using a patterning technique including a photolithography step and an etching step. According to modified embodiments, unlike that illustrated in FIG. 5A, the first sidewall patterns 121 may be etched during formation of the recess holes RH to expose an inner wall of the first trench 101 or a sidewall of the active pattern ACT.

Figure 6A:
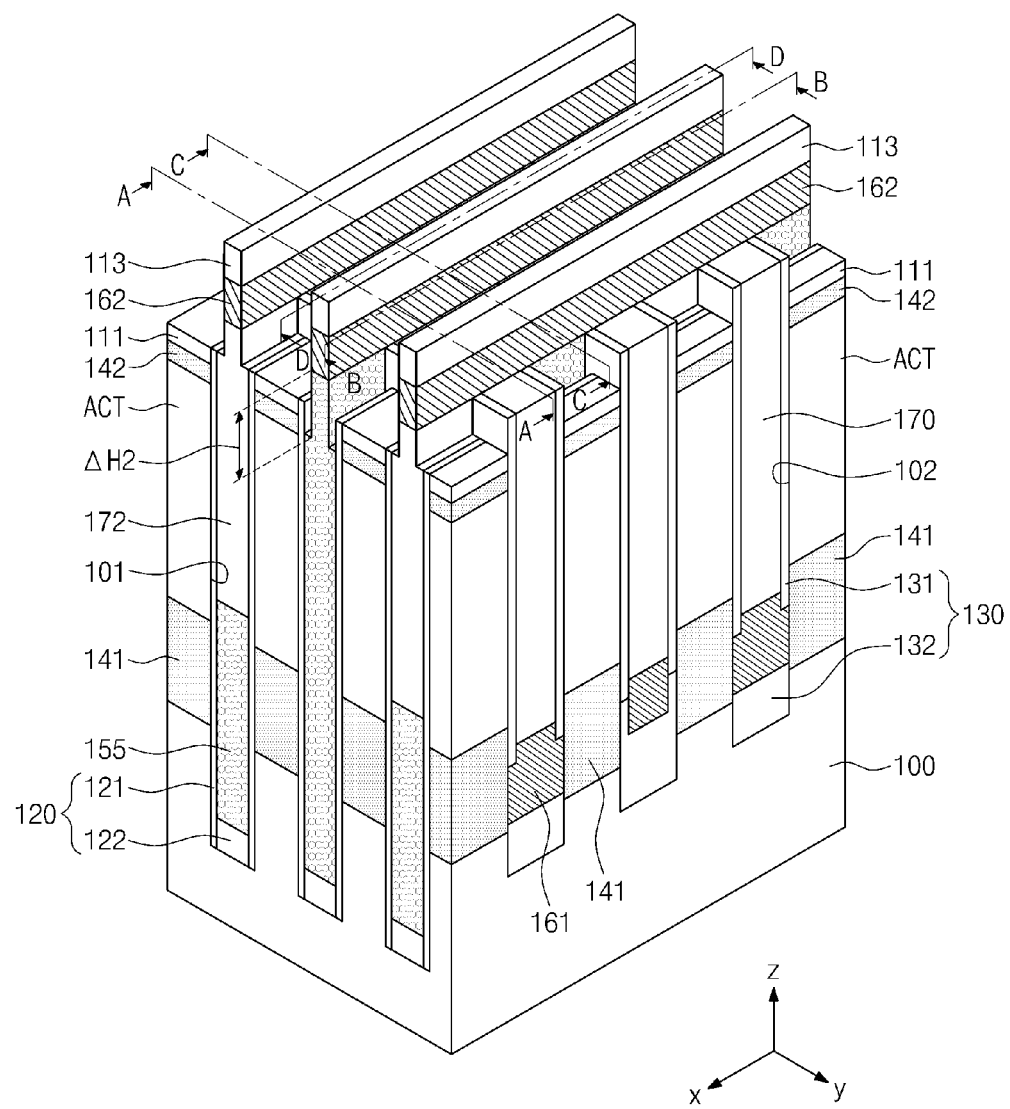
Figure 6B:
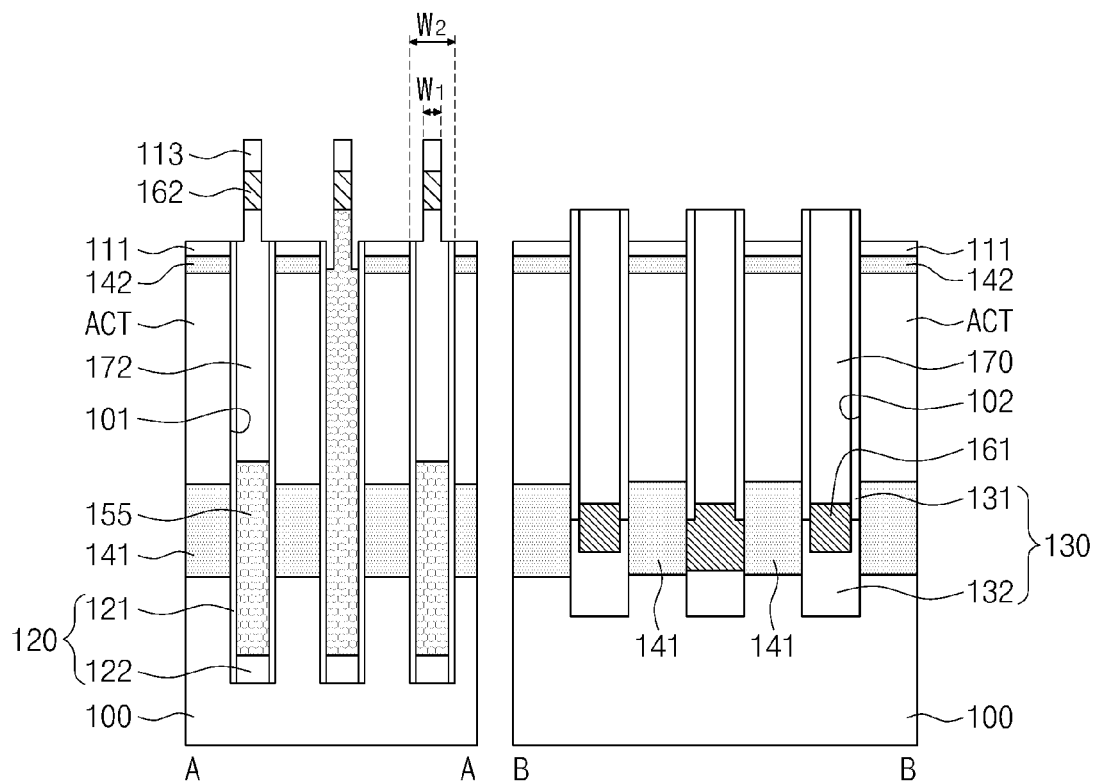
Figure 6B:
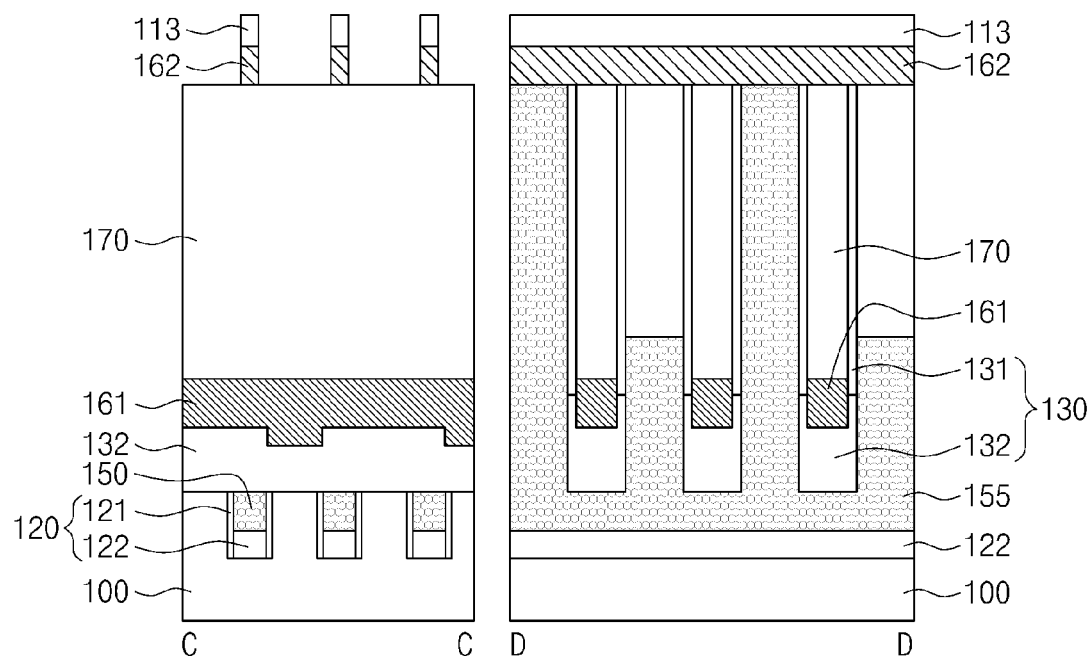

Referring to FIGS. 6A and 6B, second buried patterns 172 may be formed by filling the recess holes RH. Then, upper interconnections 162, electrically connecting the gate patterns 155 to one another, may be formed. In addition, in upper regions of the active patterns ACT, upper impurity regions 142 having the same conductivity type as the lower impurity regions 141 may be formed. The upper interconnections 162 may be formed before the upper impurity region 142 is formed but the order of formation of may be changed, according to embodiments.

The upper interconnections 162 may be formed to connect the gate patterns 155 while crossing the lower interconnections 161. More specifically, forming the upper interconnections 162 may include sequentially forming an upper conductive film and a capping film on a resultant structure where the second buried patterns 172 are formed, and then patterning the upper conductive film and the capping film to form the upper interconnection 162 and a third mask pattern 113 that are sequentially stacked. The upper conductive film or the upper interconnection 162 may include at least one of metal materials, metal nitrides and silicide materials.

The upper interconnection 162, as illustrated in FIGS. 6A and 6B, may be formed to have a width smaller than the first trench 101. As shown in FIG. 6B, W1 may be smaller than W2. A top surface of the gate pattern 155, like ΔH2 of FIG. 6A, may be recessed from both sides of the third mask pattern 113 to be lower than a top surface of the active pattern ACT. In this case, a part of the gate pattern 155 extending toward the upper portion of the active pattern ACT may be removed.

Figure 7A:
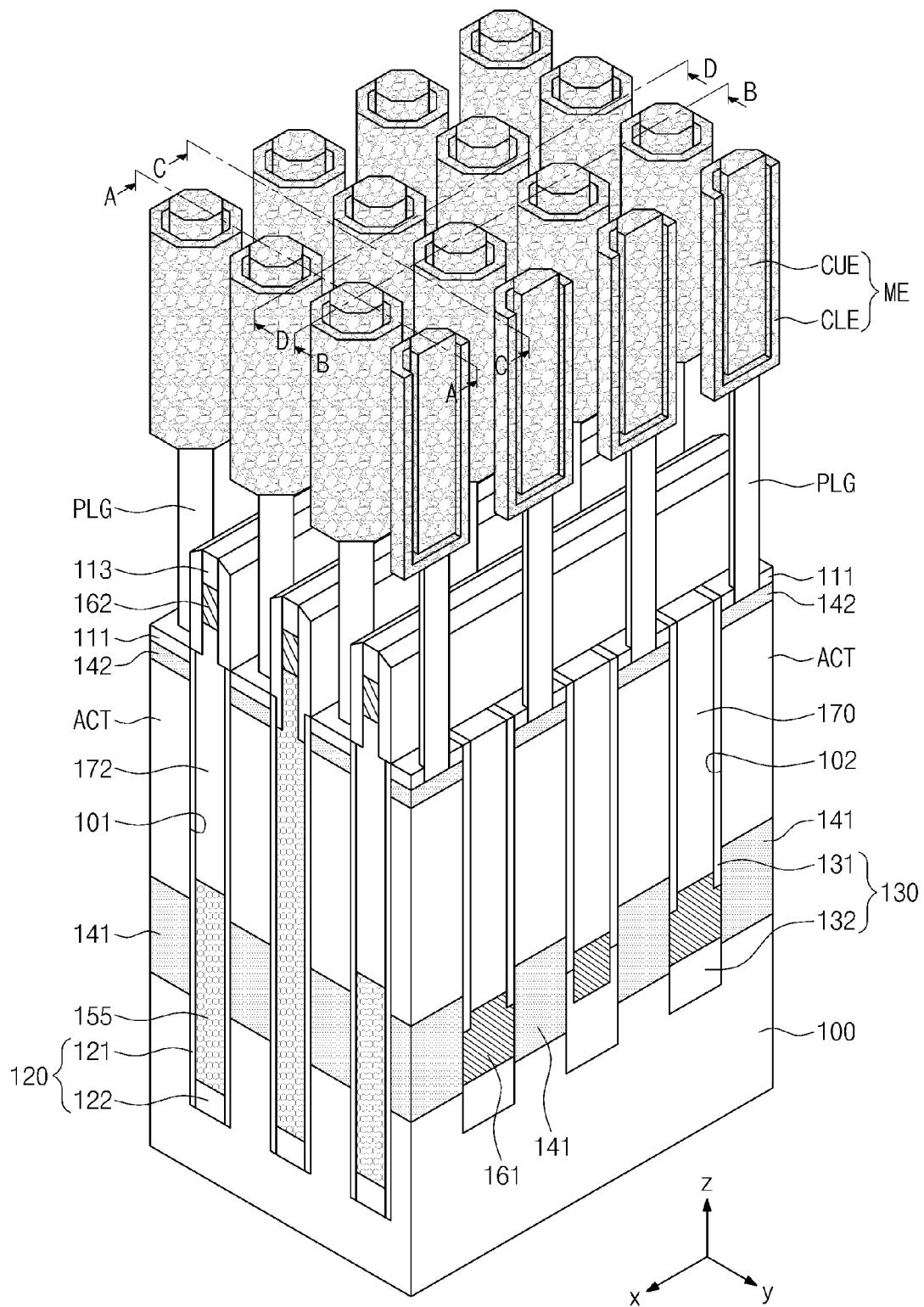
Figure 7B:
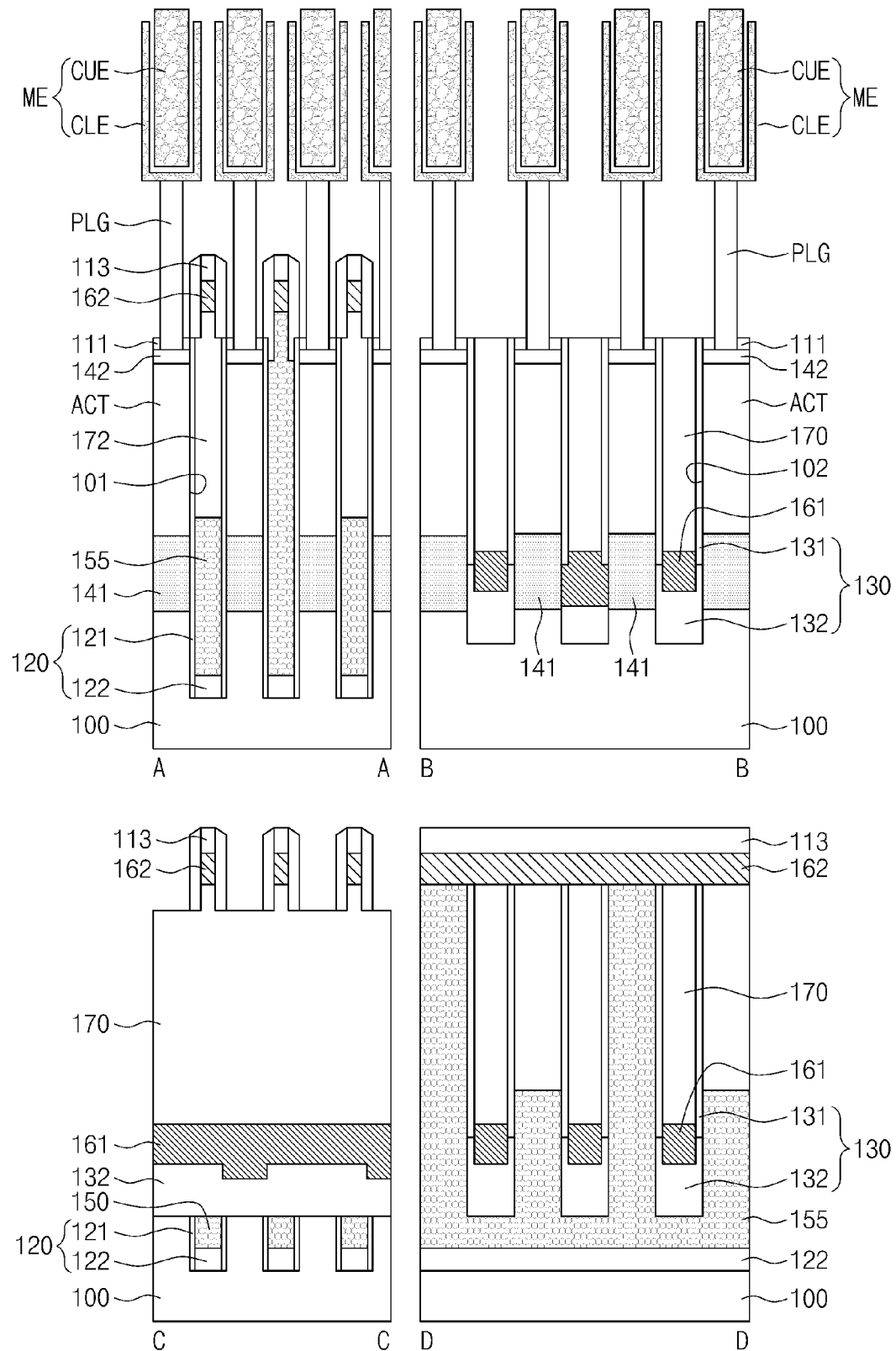

Referring to FIGS. 7A and 7B, plugs PLG connected to the upper impurity regions 142 and memory elements ME connected to the plugs PLG may be formed. The memory element ME may be a capacitor including a lower electrode CLE of capacitor connected to the upper impurity region 142 through the plug PLG and an upper electrode CUE of capacitor facing the lower electrode CLE. However, according to some embodiments, the memory element ME may be a memory element based on a capacitor, a ferroelectric capacitor, a magnetic tunnel junction, a variable resistance element or a charge storage mechanism.

Figure 11A:
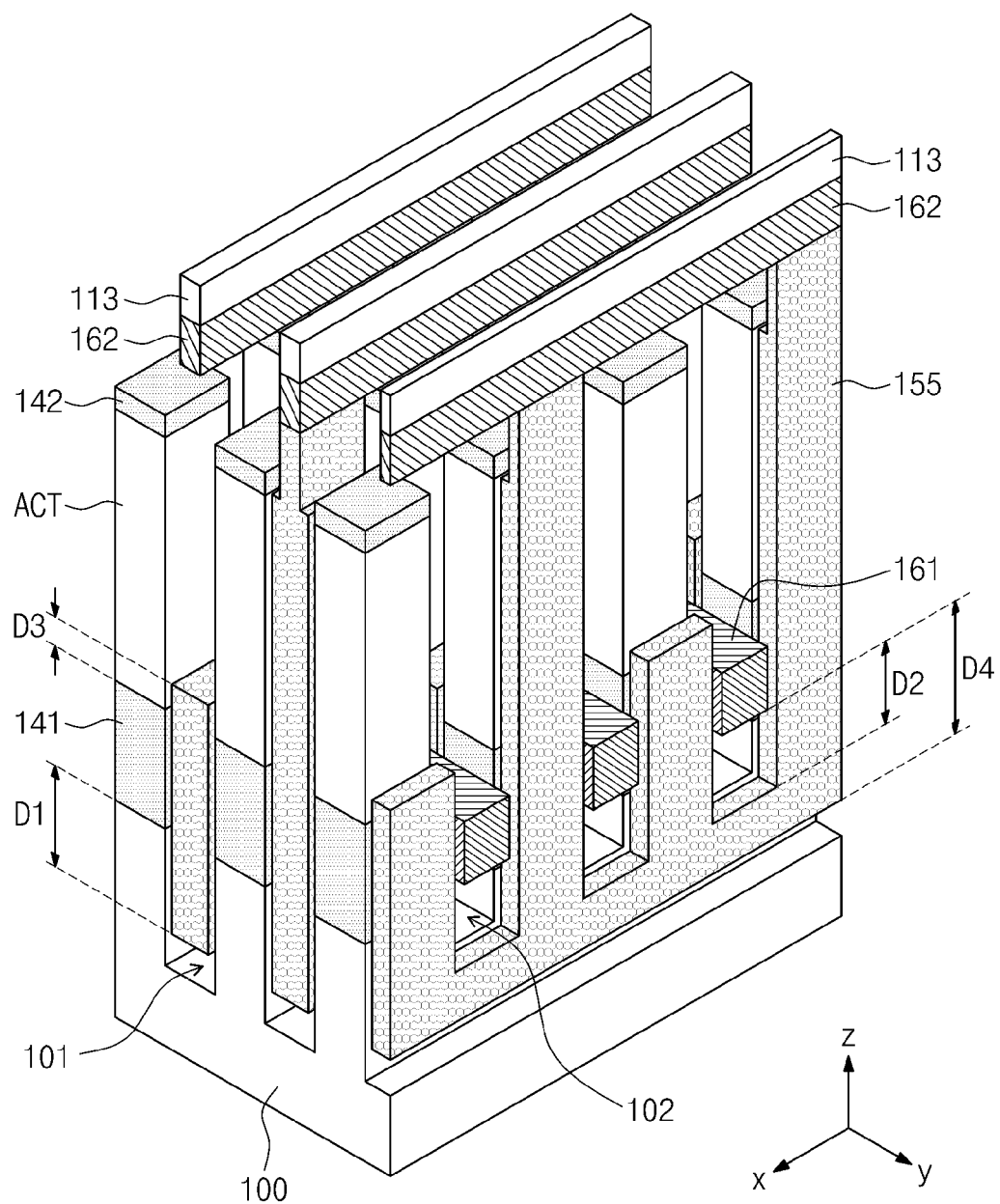
FIGS. 11A and 11B illustrate perspective views of a semiconductor device in accordance with some embodiments.
Figure 11B:
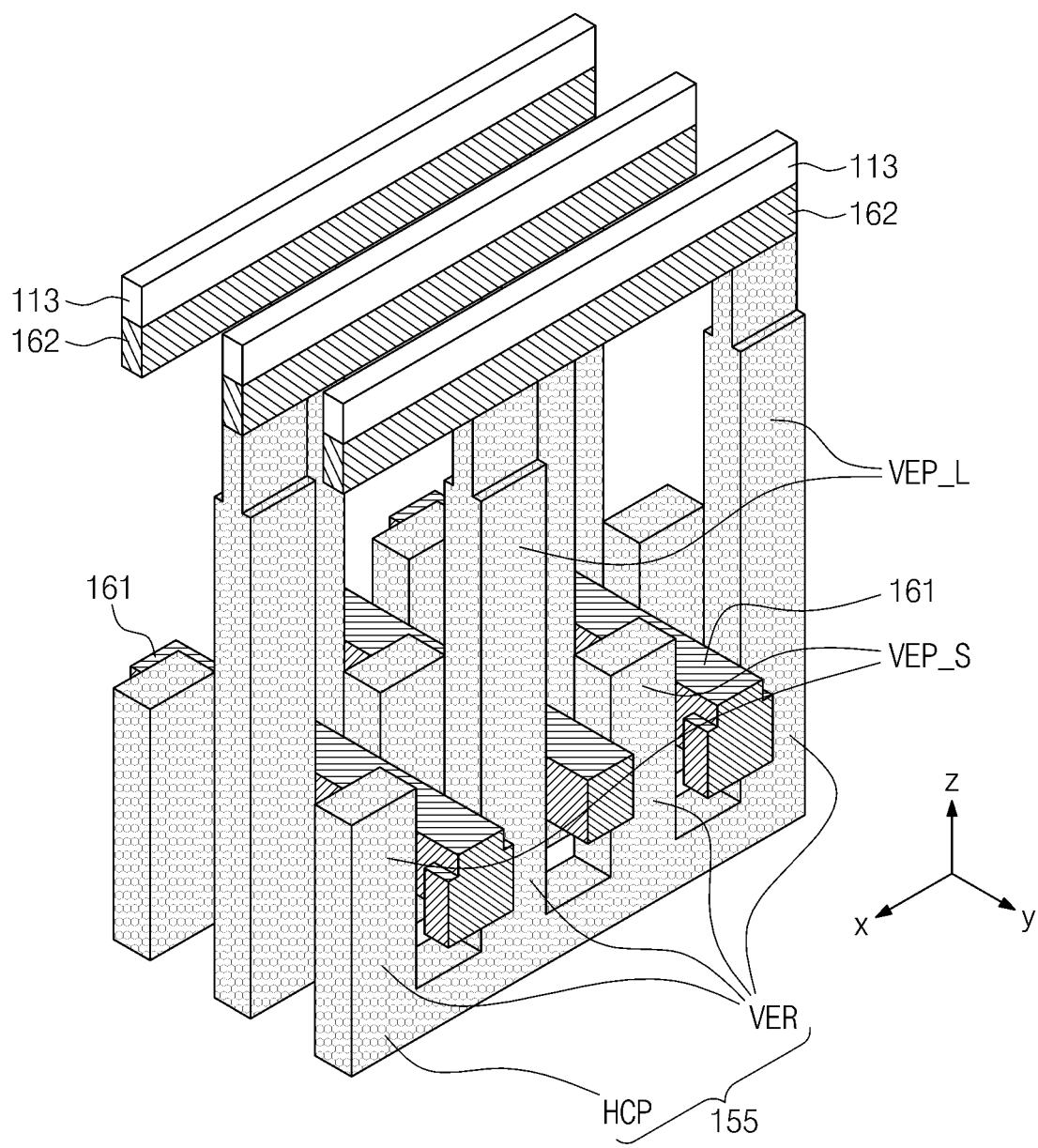

FIGS. 11A and 11B illustrate perspective views of a semiconductor device, in accordance with some embodiments of the inventive concept. In FIGS. 11A and 11B, certain elements of the semiconductor device are intentionally omitted to reduce the complexity of the drawing and to facilitate an understanding of a technical spirit of the inventive concept. For example, insulating materials, not used as a path for transferring an electrical signal, are omitted in FIGS. 11A and 11B. Also, the substrate and the active patterns are omitted in FIG. 11B to clearly show an arrangement of the gate electrodes, the lower interconnections and the upper interconnections.

Referring to FIGS. 11A and 11B, active patterns ACT are two dimensionally arranged on a substrate 100. The active patterns ACT may be pillars of a square shape extending from the substrate 100 and may be formed of semiconductor material. Each of the active patterns ACT may include an upper impurity region 142 and a lower impurity region 141 vertically separated from each other within the active pattern ACT. Each of the active patterns ACT may have sidewalls defined by first trenches 101 parallel to an x direction (or extending vertically from first and second opposing sides of the substrate 100) and second trenches 102 crossing or intersecting with the first trenches 101 (or extending vertically from third and fourth opposing sides of the substrate). In an implementation, each of the active patterns ACT may be arranged between two of the first trenches 101 and/or between two of the second trenches 102.

Lower interconnections 161 crossing or intersecting with the active patterns ACT may be disposed in each of the second trenches 102. Upper interconnections 162, crossing the lower interconnections 161, may be disposed over upper portions of the first trenches 101. The lower and upper interconnections 161 and 162 may include conductive material, such as a metal film. For example, the lower and upper interconnections 161 and 162 may include at least one of metal materials, metal nitrides and silicide materials.

Gate patterns 155, having top surfaces connected to the upper interconnection 162, may be disposed in the first trenches 101. The gate patterns 155 may be formed to face or be adjacent to sidewalls of the active patterns ACT. According to some embodiments of the inventive concept, a bottom surface of the gate pattern 155 may extend under the second trench 102. Accordingly, a bottom surface of the gate pattern 155 may be formed under a bottom surface of the lower interconnection 161 (i.e., D4>0) and a top surface of the gate pattern 155 in the second trench 102 may be located under the bottom surface of the lower interconnection 161 (i.e., D2>0). Also, the bottom surface of the gate pattern 155 may be located under the lower impurity region 141 (i.e., D1>0).

According to some embodiments of the inventive concept, as illustrated in FIGS. 11A and 11B, each of the gate patterns 155 may include a plurality of vertical electrode portions (VEP) and a horizontal connection portion (HCP). The vertical electrode portions (VEP) may be disposed at regions within the first trenches 101 and may not be included within the second trenches 102. The vertical electrode portions (VEP) may face sidewalls of the active patterns ACT. The horizontal connection portion (HCP) may be formed to cross the second trenches 102 under the lower interconnection 161 and may connect lower regions of the vertical electrode portions (VEP). In addition, the vertical electrode portions (VEP) may include long vertical electrode portions VEP_L connected to the upper interconnection 162 and short vertical electrode portions VEP_S spaced apart from the upper interconnection 162. In an implementation, insulating material (e.g., the second buried pattern 172 in FIG. 6A) may be interposed between a top surface of the short vertical electrode portions VEP_S and a bottom surface of the upper interconnection 162.

The long vertical electrode portion VEP_L may face or be adjacent to a sidewall of the active pattern ACT, at a region located between the lower and upper impurity regions 141 and 142 (hereinafter, referred to as a "channel region"). An electric potential of the channel region may be effectively controlled by an electric potential applied to the long vertical electrode portion VEP_L. For example, the channel region and the long vertical electrode portion VEP_L may constitute a MOS capacitor. The short vertical electrode portions VEP_S may face or be adjacent to a sidewall of the lower impurity region 141. For example, a top surface of the short vertical electrode portions VEP_S may be formed to be higher than a top surface of the lower impurity region 141 (i.e., D3>0). Accordingly, an electric potential of the lower impurity region 141 may be effectively controlled by an electric potential applied to the short vertical electrode portions VEP_S. That is, the lower impurity region 141 and the short vertical electrode portions VEP_S may also constitute a MOS capacitor. As illustrated in FIGS. 11A and 11B, the top surface of the short vertical electrode portions VEP_S may be located lower than the upper impurity region 142. Therefore, an electric potential of the channel region may be substantially independent of an electric potential applied to the short vertical electrode portions VEP_S.

FIGS. 12A, 12B, 13A and 13B illustrate perspective views of a semiconductor device, in accordance with some modified embodiments of the inventive concept. Like FIGS. 11A and 11B, certain elements of a semiconductor device are intentionally omitted to reduce the complexity of the drawing and to facilitate a better understanding of a technical spirit of the inventive concept. In addition, for brevity of description, the description of common features may be omitted.

Figure 12A:
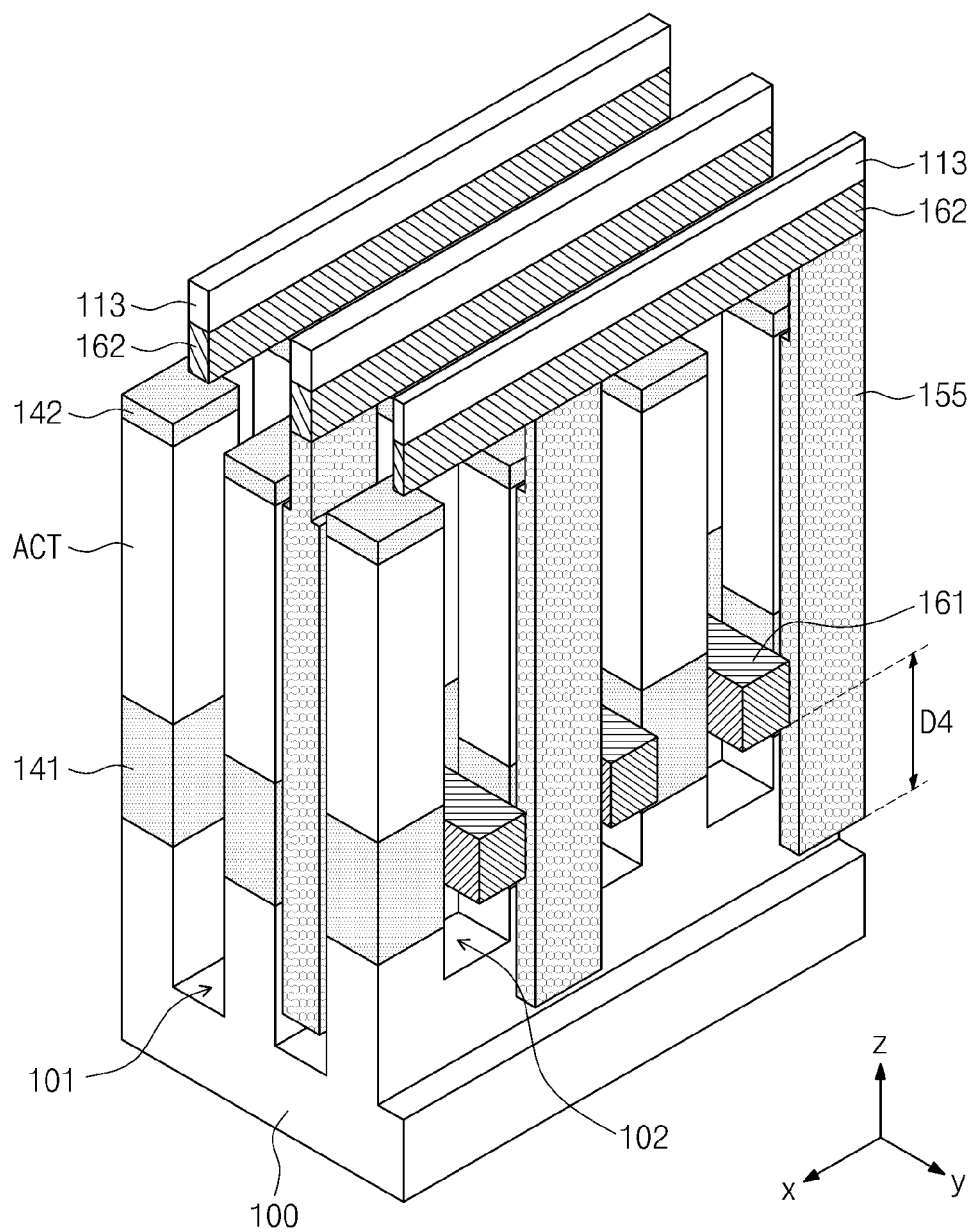
FIGS. 12A and 12B illustrate perspective views of a semiconductor device, in accordance with some modified embodiments.
Figure 12B:
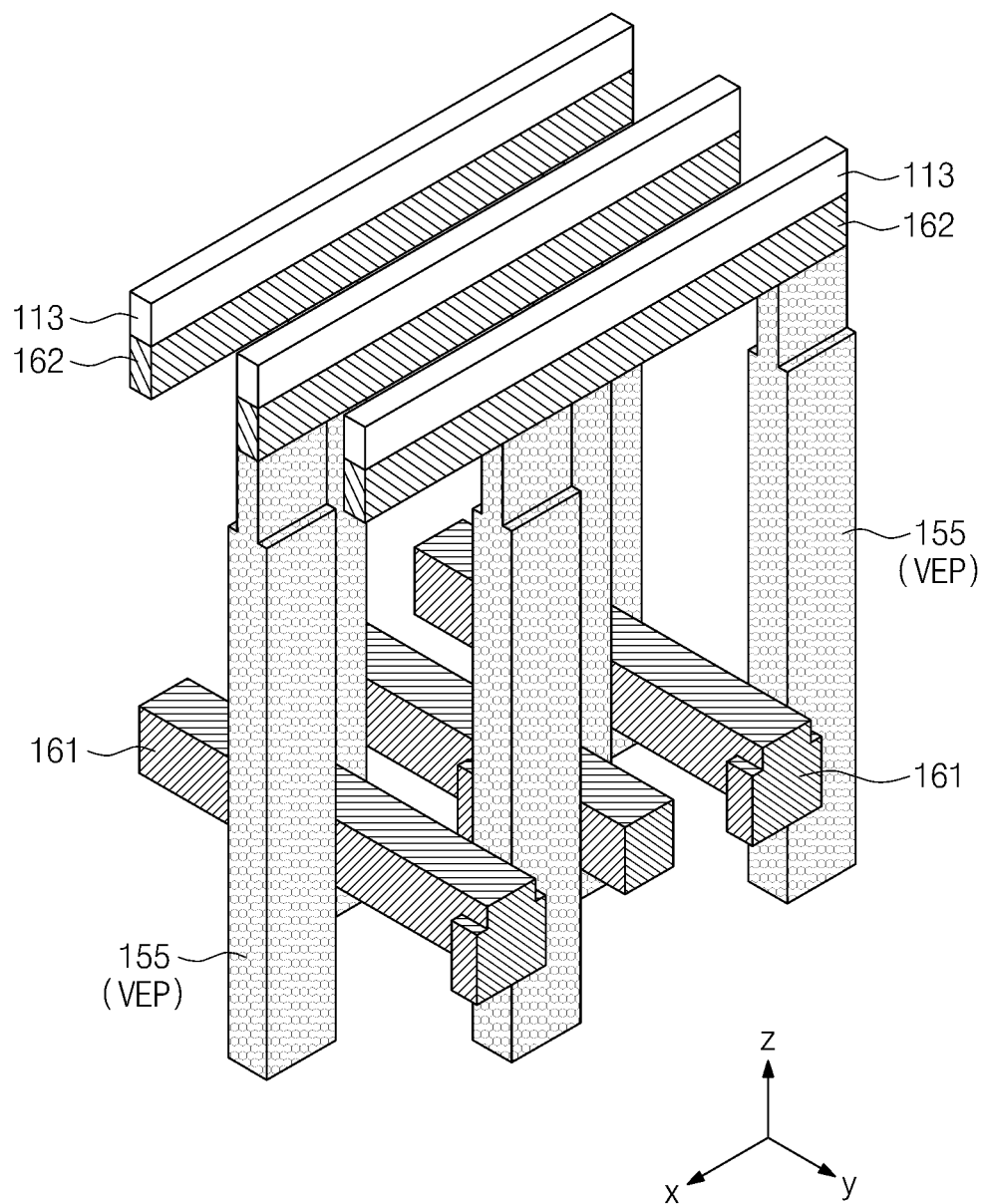

According to some modified embodiments, a plurality of gate patterns 155, horizontally separated from one another, may be disposed in one of the first trenches 101. For example, as illustrated in FIGS. 12A and 12B, the gate patterns 155 may be locally formed at regions included in the first trench 101 while not being included in the second trench 102. In contrast to the embodiments illustrated in FIGS. 11A and 11B, the gate pattern 155, in accordance with the embodiment of FIG. 12A, may include only the vertical electrode portions (VEP), without the horizontal connection portion (HCP) disposed under the lower interconnection 161.

Figure 13A:
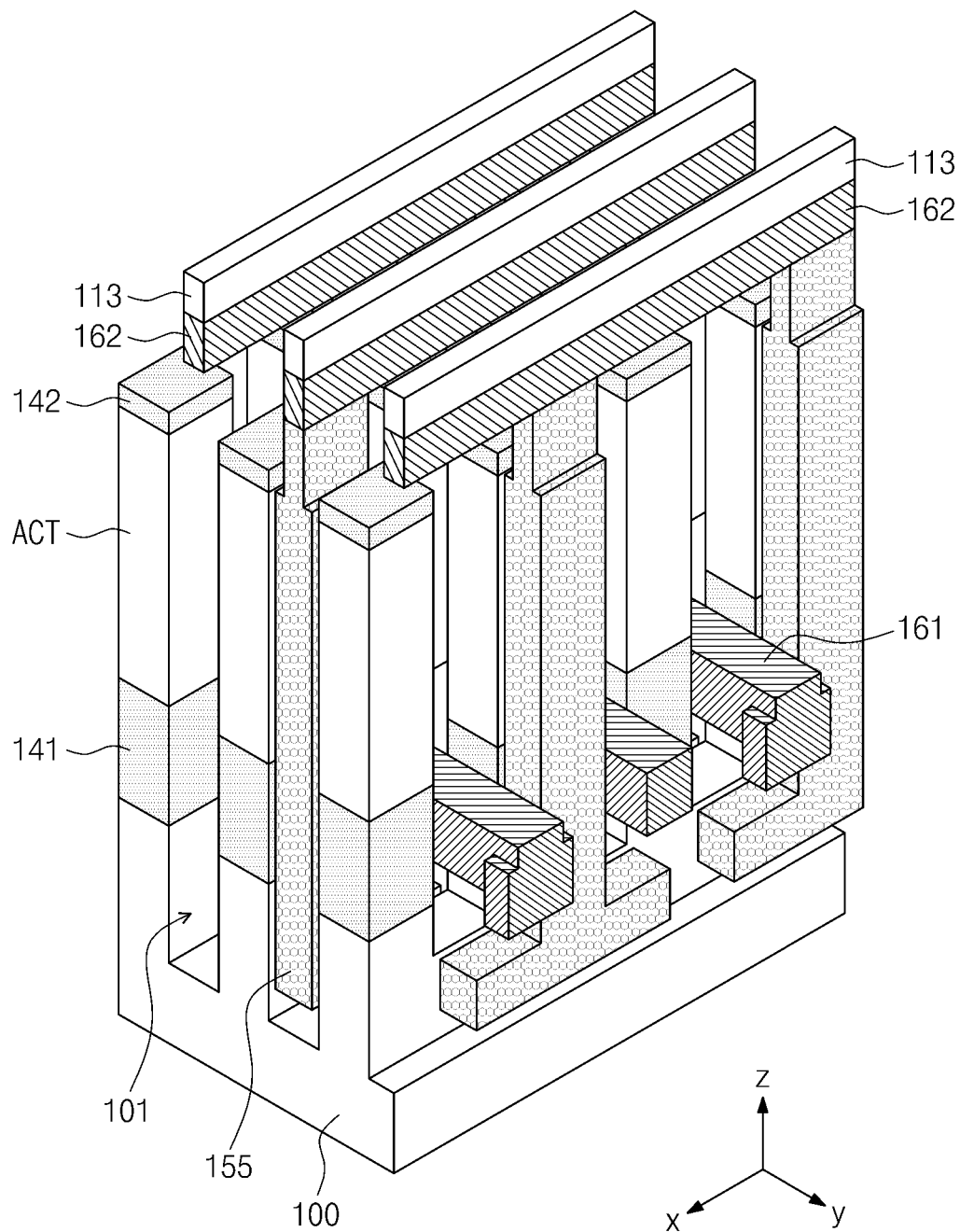
FIGS. 13A and 13B illustrate perspective views of a semiconductor device, in accordance with some other modified embodiments.
Figure 13B:
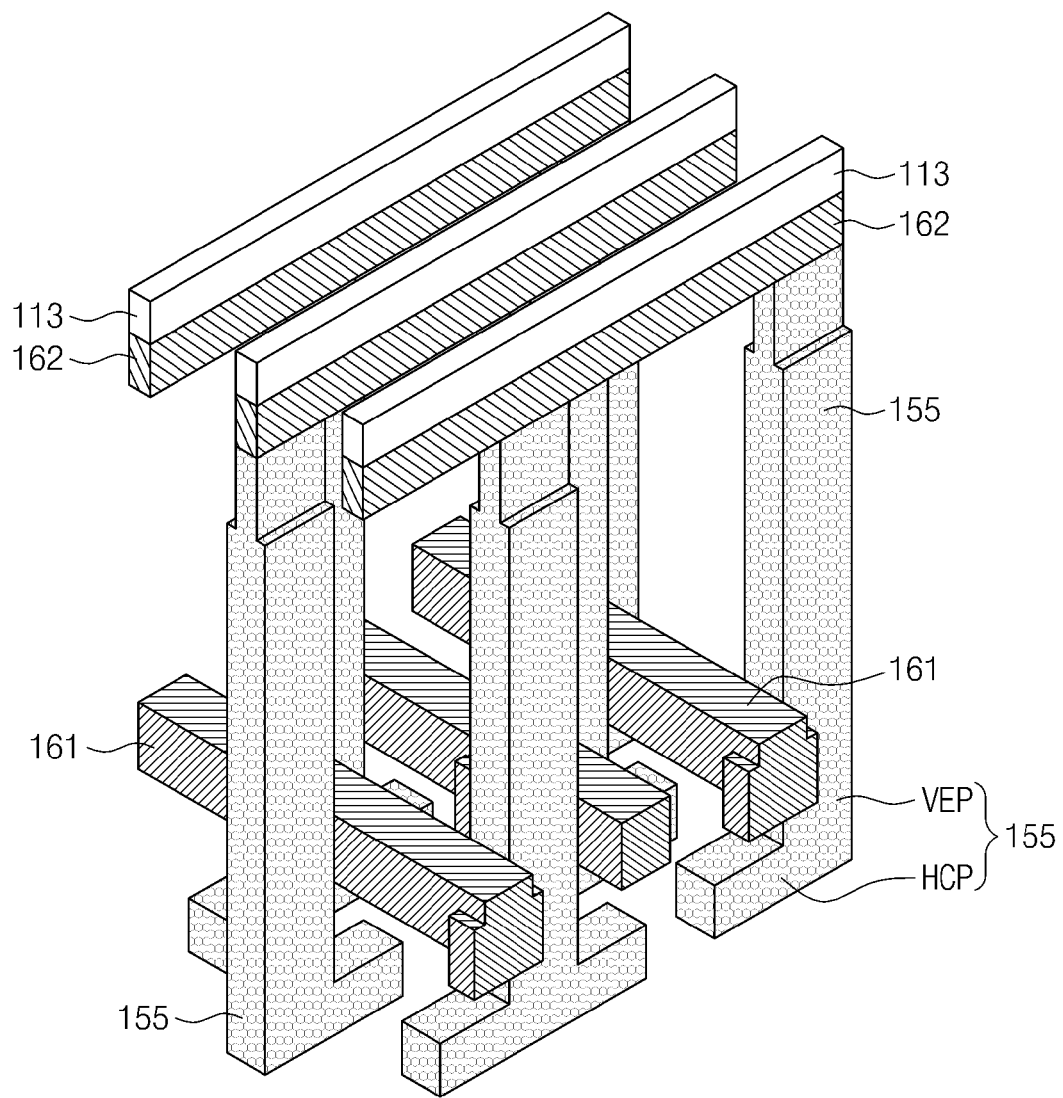

As illustrated in FIGS. 13A and 13B, each of the gate patterns 155 may include the vertical electrode portion (VEP) and a part flange that is not connected with adjacent gate patterns 155, i.e., the horizontal connection portion (HCP). The flange may be disposed under the lower interconnection 161. The flange of the semiconductor device may be manufactured by forming the recess hole RH, as described with reference to FIG. 5A, to have a bottom end lower than a bottom surface of the gate conductive film 150.

According to some modified embodiments, the number of the vertical electrode portions (VEP) in the first trench 101 may be half the number of vertical electrode portions (VEP) in the second trenches 102. For example, in the odd-numbered ones of the first trenches 101, the vertical electrode portions (VEP) may be disposed between the odd-numbered ones of active patterns ACT, e.g., a first pair of adjacent active patterns ACT along an outermost first trench 101, but not disposed between the even-numbered ones of active patterns ACT, e.g., a second pair of adjacent active patterns ACT along the outermost first trench 101. In the even-numbered ones of first trenches 101, e.g. the first trench 101 adjacent to the outermost first trench 101, the vertical electrode portions (VEP) may be disposed between the even-numbered ones of active patterns ACT, e.g., a second pair of adjacent active patterns ACT, but not disposed between the odd-numbered ones of active patterns ACT, e.g., a first pair of adjacent active patterns ACT.

Figure 14:
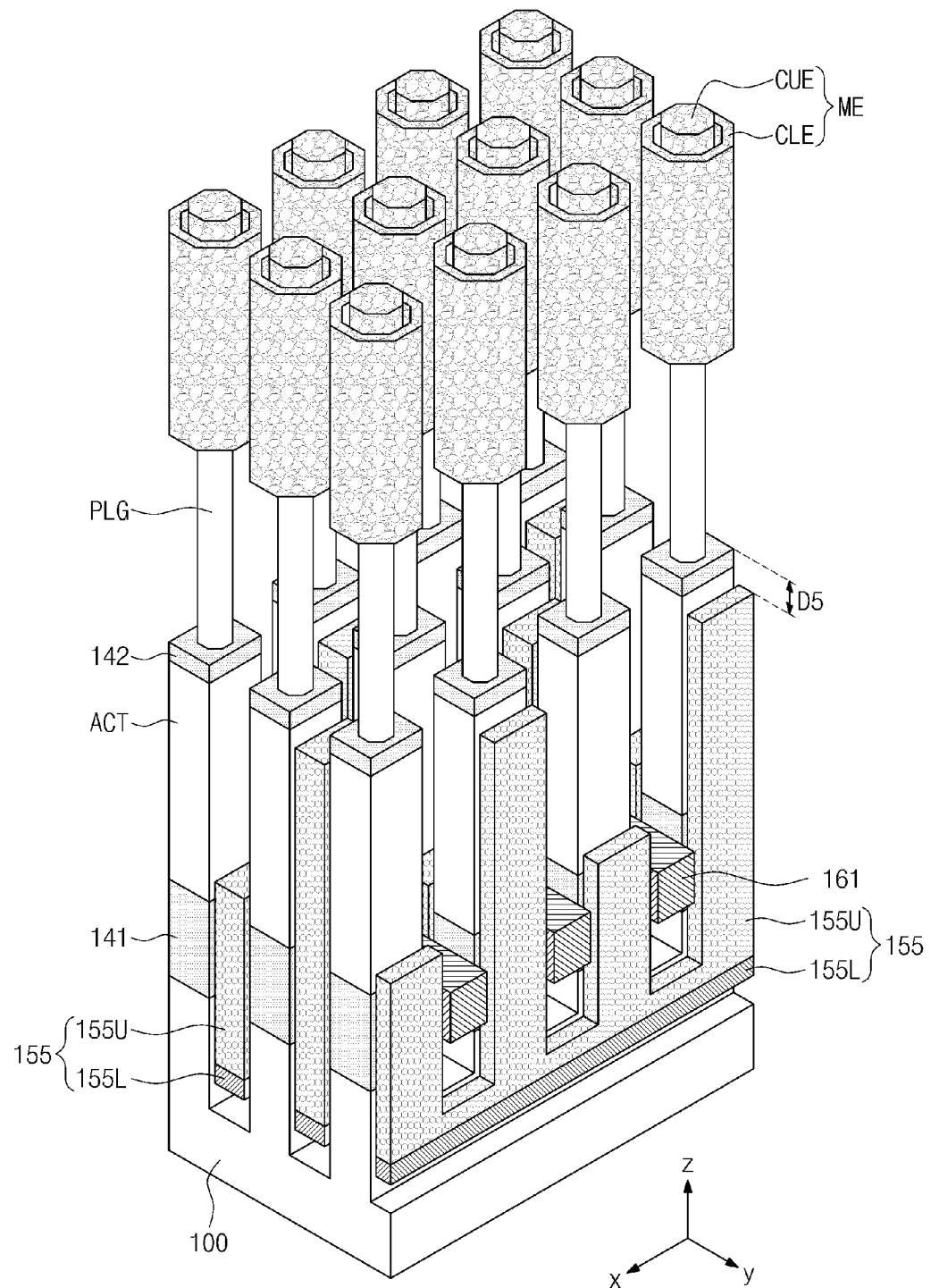
FIG. 14 illustrates a perspective view of a semiconductor device, in accordance with some other modified embodiments.

FIG. 14 illustrates a perspective view of a semiconductor device, in accordance with some other modified embodiments of the inventive concept.

According to some embodiments, the gate pattern 155 may not be completely divided by the second trenches 102. As such, each of the gate patterns 155 may function as an interconnection transmitting an external electric signal without an additional upper interconnection. Thus, the semiconductor device, as illustrated in FIG. 14, may not include an additional upper interconnection. Since an additional upper interconnection is not required, manufacturing of the semiconductor device may be simpler and less costly.

In the present embodiments, to reduce a resistance of the gate pattern 155, each of the gate patterns 155 may include at least one film having a low resistivity and at least one film having a higher resistivity than the film having a low resistivity. For example, as illustrated in FIG. 14, each of the gate patterns 155 may include a lower gate pattern 155L and an upper gate pattern 155U that are sequentially stacked. The lower gate pattern 155L may cross the lower interconnections 161 under the lower interconnections 161. Also, the upper gate pattern 155U may be formed to face or abut a sidewall of the active pattern ACT. According to some embodiments, the lower gate pattern 155L may be formed of material having resistivity lower than the upper gate pattern 155U. For example, the lower gate pattern 155L may include at least one of metal materials, metal nitrides, metal silicides and carbon nano structures, and the upper gate patterns 155U may include doped semiconductor material or metal nitride.

The embodiments illustrated in FIG. 14, may offer many advantages. For example, the long vertical electrode portion VEP_L, constituting a MOS capacitor, together with the channel region may be formed not to face a sidewall of the upper impurity region 142. That is, in a vertical position, the long vertical electrode portion VEP_L may have a top surface located under the upper impurity region 142 (i.e., D5>0). This structure may ease a technical difficulty according to a gate induced drain leakage (GIDL) phenomenon.

In addition, embodiments in which the top surface of the long vertical electrode portion VEP_L is formed to be higher than a top surface of the active pattern ACT, the plug PLG is required to have a small width to obtain a separated distance between the plug PLG and the gate pattern 155. However, according to embodiments illustrated in FIG. 14, since a need of obtaining the separated distance is reduced, the plug PLG may be formed to have an increased width or an increased cross sectional area. An increase of cross sectional area may bring about a reduction of electrical resistance of the plug PLG.

Figure 15A:
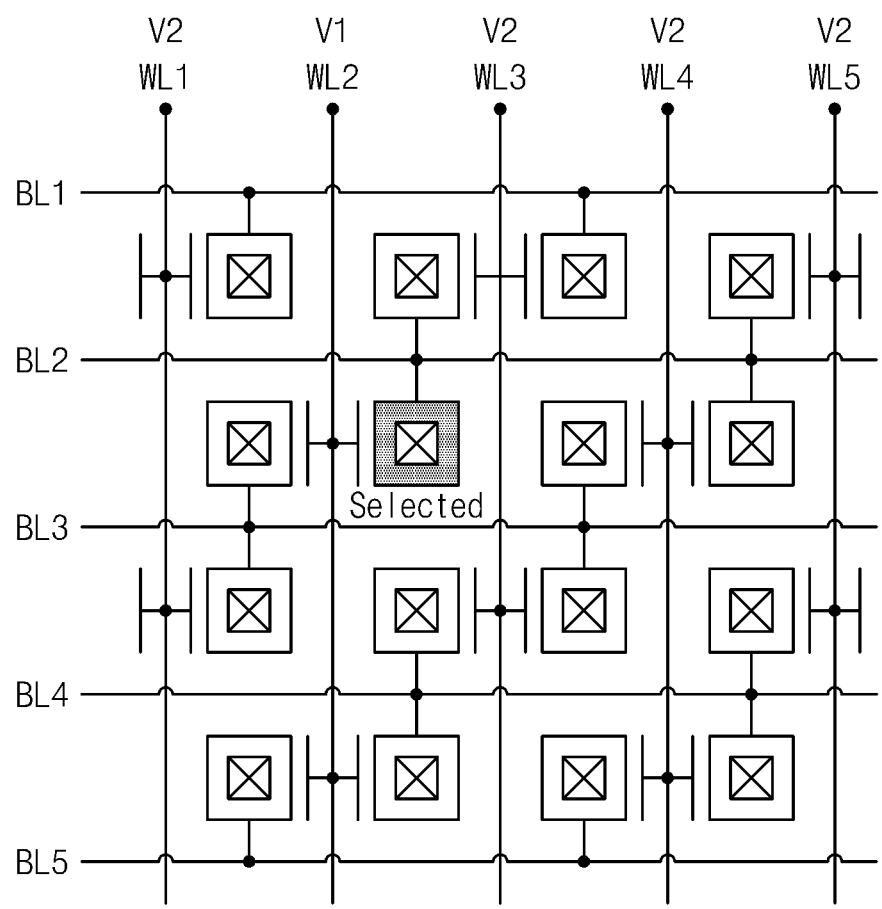
FIGS. 15A and 15B illustrate drawings for explaining an operation method of semiconductor device, in accordance with some embodiments.
Figure 15B:
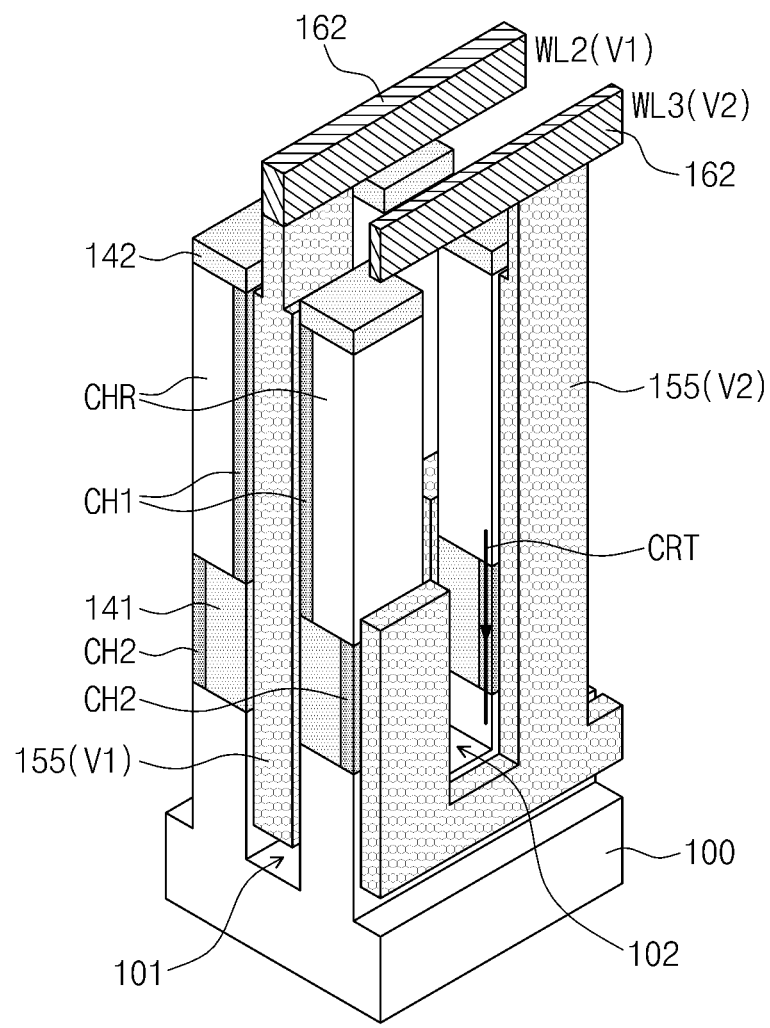

FIGS. 15A and 15B illustrate stages in an operation method of a semiconductor device, in accordance with some embodiments.

According to some embodiments of the inventive concept, the active pattern ACT, the upper interconnection 162 and the lower interconnection 161 may be used as a channel region, a word line and a bit line respectively. In embodiments not including the upper interconnection 162, the gate pattern 155 may be used as the word line. In this case, an operation method, as illustrated in FIG. 15A, may include a cell selection step selecting one memory cell by selecting one (e.g., WL2) of the word lines and one (e.g., BL2) of the bit lines.

According to some embodiments, during the cell selection step, a first voltage V1 that may invert the channel region, may be applied to the selected word line WL2. A second voltage V2 that may invert the lower impurity region 141, may be applied to other word lines (e.g., WL1, WL3, WL4 and WL5) that are not selected. For example, when the conductivity type of the lower impurity region 141 is an N-type, the first voltage V1 may be a positive voltage and the second voltage V2 may be a negative voltage. In addition, when an impurity concentration of the lower impurity region 141 is higher than an impurity concentration of the channel region, an absolute value of the second voltage V2 may be greater than an absolute value of the first voltage V1.

As illustrated in FIG. 15B, a first channel CH1 connecting the lower and upper impurity regions 141 and 142 may be formed on a sidewall of the channel region CHR. A second channel CH2 connecting the channel region CHR and the substrate 100 may be formed on a sidewall of the lower impurity region 141. Charges being accumulated in the channel region CHR may discharge into the substrate 100 through the second channel CH2. For example, a floating body phenomenon in the active patterns ACT may be prevented.

Figure 16:
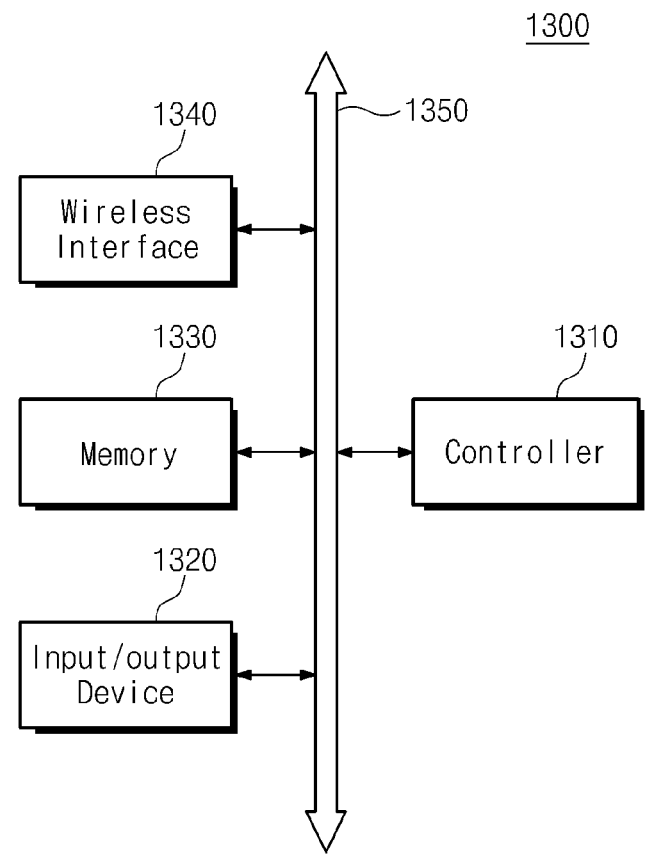
FIGS. 16 and 17 illustrate drawings for schematically explaining electronic devices including vertical channel transistors, in accordance with some embodiments.
Figure 17:
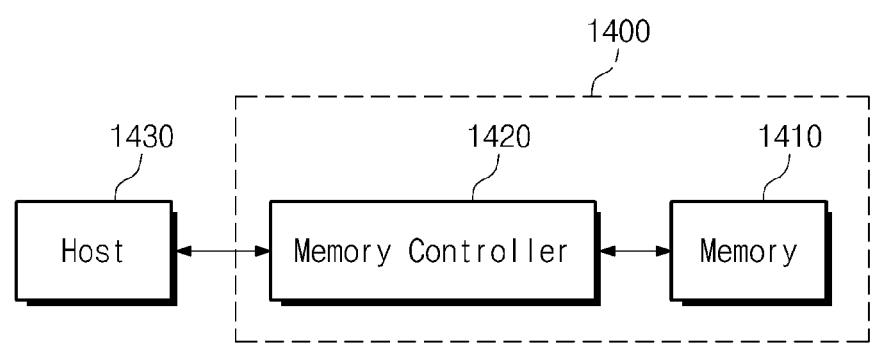

FIGS. 16 and 17 illustrate schematic drawings of electronic devices including vertical channel transistors, in accordance with some embodiments.

Referring to FIG. 16, an electronic device 1300 including a vertical channel transistor, in accordance with the some embodiments, may be may be a PDA, a laptop computer, a portable computer, a web tablet, a wireless phone, a cell phone, a digital music player, a wire/wireless electronic device, or a composite of such electronic devices, including at least two of such devices. The electronic device 1300 may include a controller 1310, an input/output device 1320 such as a keypad, a keyboard, a display, etc., a memory 1330 and a wireless interface 1340 that are combined with one another through a bus 1350. The controller 1310 may include, for example, one or more microprocessors, digital signal processors, micro controllers, or something like that. The memory 1330 may be used to store commands executed by the controller 1310. The memory 1330 may be used to store user data. The memory 1330 may include a vertical channel transistor, in accordance with the some embodiments of the inventive concept. The electronic device 1300 may use the wireless interface 1340 to transmit data to a wireless communication network that communicates using a RF signal and/or receive data from the network. For example, the wireless interface 1340 may include an antenna, a wireless transceiver, etc. The electronic device 1300 may be used in a communication interface protocol of a third generation such as CDMA, GSM, NADC, E-TDMA, CDMA2000.

Referring to FIG. 17, the semiconductor memory devices, in accordance with embodiments of the inventive concept may be used to embody a memory system. The memory system 1400 may include a memory device 1410 to store large amounts of data and a memory controller 142. The memory controller 142 may control the memory device 1410 to read data from the memory device 1410 or write data in the memory device 1410 in response to a read/write request of a host 1430. The memory controller 1420 may constitute an address mapping table to map an address provided from a mobile device or a computer system into a physical address of the memory device 1410. The memory device 1410 may include the vertical channel transistor, in accordance with embodiments of the inventive concept.

According to embodiments of the inventive concept, a vertical channel transistor, including gate patterns extending under a lower interconnection is provided. When a voltage that can invert a lower impurity region is applied to an unselected word line, a channel region may be electrically connected to a substrate. As a result, a floating body phenomenon in a vertical channel transistor may be suppressed.

According to some embodiments, gate patterns may be formed that include a portion crossing lower interconnections, under the lower interconnections. In those embodiments, an additional upper interconnection may not be formed. As a result, manufacturing may be simplified and less costly.

In embodiments in which an upper interconnection is not formed, gate patterns may be formed not to overlap an upper impurity region in a vertical position. Accordingly, a technical difficulty according to a gate induced drain leakage (GIDL) phenomenon may be eased. In addition, according to embodiments, since a sufficient separation distance between a plug and a gate pattern may be achieved, the plug may be formed to have an increased cross sectional area.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate including active patterns extending between first trenches and between second trenches, the first and second trenches intersecting each other; and
    gate patterns disposed within the first trenches,
    wherein each of the active patterns includes a lower impurity region, an upper impurity region, and a channel region between the lower and upper impurity regions, the lower and upper impurity regions being vertically spaced apart from each other and having a conductivity type different from the substrate, and the channel region having the same conductivity type as the substrate, and
    a bottom surface of the gate pattern is lower than a bottom surface of the lower impurity region.

2. The semiconductor device as claimed in claim 1, further comprising lower interconnections in the second trenches, the lower interconnections electrically connecting the lower impurity regions and crossing the gate patterns,
    wherein, the lower interconnections are disposed between a top surface of the gate pattern and a bottom surface of the gate pattern.

3. The semiconductor device as claimed in claim 1, wherein each of the gate patterns includes vertical electrode portions, the vertical electrode portions being perpendicular to a top surface of the substrate, wherein the plurality of gate patterns are horizontally aligned and spaced from one another, and each gate pattern is disposed in a different one of the first trenches.

4. The semiconductor device as claimed in claim 3, wherein the gate patterns are positioned adjacent to sidewalls of every other active pattern starting with a first active pattern in every other first trench, starting with an outermost first trench, and are disposed adjacent to sidewalls of every other active pattern starting with a second active pattern in every other first trench, starting with a first trench adjacent to the outermost first trench.

5. The semiconductor device as claimed in claim 3, wherein one gate pattern is disposed around one of the active patterns.

6. The semiconductor device as claimed in claim 1, wherein each of the gate patterns includes:
    vertical electrode portions that extend perpendicular to a top surface of the substrate; and
    a horizontal connection portion connecting lower regions of the vertical electrode portions, the horizontal connection portion intersecting the second trenches.

7. The semiconductor device as claimed in claim 6, wherein the vertical electrode portions include short vertical electrode portions and long vertical electrode portions alternately arranged in the first trenches,
    wherein top surfaces of the short and long vertical electrode portions are higher than the lower impurity region.

8. The semiconductor device as claimed in claim 7, further comprising upper interconnections over the gate patterns, the upper interconnections crossing over the second trenches,
    wherein, the long vertical electrode portions in one of the gate patterns are directly connected to the upper interconnection and top surfaces of the short vertical electrode portions in another one of the gate patterns are spaced apart from the upper interconnection.

9. The semiconductor device as claimed in claim 6, wherein a top surface of the horizontal connection portion is closer to a bottom surface of the first trench than the lower impurity region.

10. The semiconductor device as claimed in claim 6, wherein two gate patterns are disposed around one of the active patterns.

11. The semiconductor device as claimed in claim 1, wherein top surfaces of the gate patterns are under a bottom surface of the upper impurity region.

12. The semiconductor device as claimed in claim 1, wherein the gate pattern includes a lower gate pattern and an upper gate pattern that are sequentially stacked,
    wherein the lower gate pattern is formed of material having a lower resistivity than the upper gate pattern.

13. A semiconductor device, comprising:
    a substrate including first trenches and second trenches, the first and second trenches intersecting each other;
    gate patterns disposed within the first trenches; and
    active patterns vertically extending between the first trenches and between the second trenches, each of the active patterns including a vertical stack of a lower impurity region, a channel region, and an upper impurity region, in that order,
    wherein the lower impurity region and the upper impurity region have a conductivity type different from the substrate, the channel region has the same conductivity type as the substrate, and the gate patterns overlap and extend lower than a bottom surface of the lower impurity region.

14. The semiconductor device as claimed in claim 13, wherein a top surface of the gate patterns are lower than the upper impurity region.

15. The semiconductor device as claimed in claim 14, wherein the gate patterns include horizontal portions extending from a bottom surface of the gate patterns, the horizontal portions intersecting the second trenches.

16. The semiconductor device as claimed in claim 15, wherein a lower portion of the horizontal portion includes a material of a lower resistivity than a remainder of the gate pattern.

17. The semiconductor device as claimed in claim 13, wherein the gate patterns include horizontal portions extending from a bottom surface of the gate patterns, the horizontal portions intersecting the second trenches.

* * * * *